(12) United States Patent
Maki

(10) Patent No.: US 9,472,495 B2
(45) Date of Patent: Oct. 18, 2016

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventor: Yukio Maki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/156,026

(22) Filed: Jan. 15, 2014

(65) Prior Publication Data

US 2014/0203441 A1 Jul. 24, 2014

(30) Foreign Application Priority Data

Jan. 18, 2013 (JP) ................. 2013-007115

(51) Int. Cl.
| | | |
|---|---|---|
| *H01L 29/06* | (2006.01) | |
| *H01L 29/40* | (2006.01) | |
| *H01L 23/04* | (2006.01) | |
| *H01L 23/52* | (2006.01) | |
| *H01L 23/498* | (2006.01) | |
| *H01L 27/108* | (2006.01) | |
| *H01L 21/768* | (2006.01) | |
| *H01L 23/522* | (2006.01) | |

(52) U.S. Cl.
CPC ....... *H01L 23/498* (2013.01); *H01L 21/76832* (2013.01); *H01L 21/76834* (2013.01); *H01L 21/76897* (2013.01); *H01L 27/10814* (2013.01); *H01L 27/10855* (2013.01); *H01L 27/10894* (2013.01); *H01L 23/5223* (2013.01); *H01L 2924/0002* (2013.01)

(58) Field of Classification Search
CPC ........... H01L 29/0657; H01L 2924/14; H01L 2924/01079; H01L 2924/01078; H01L 2924/15311; H01L 2924/01029; H01L 21/76898; H01L 23/481; H01L 23/5329; H01L 23/5226
USPC ....... 257/618, 621, 687, 698, 700, 750, 758, 257/773
See application file for complete search history.

(56) References Cited

U.S. PATENT DOCUMENTS

| | | | | |
|---|---|---|---|---|
| 6,235,623 | B1 * | 5/2001 | Lee ................................ | 438/618 |
| 6,709,915 | B2 * | 3/2004 | Lee ................................ | 438/239 |

(Continued)

FOREIGN PATENT DOCUMENTS

| | | |
|---|---|---|
| JP | 2010-040538 A | 2/2010 |
| JP | 2011-077539 A | 4/2011 |
| JP | 2012-054342 A | 3/2012 |

OTHER PUBLICATIONS

Japanese Office Action issued in Application No. 2013-007115, Dated Aug. 2, 2016.

*Primary Examiner* — Hsien Ming Lee
(74) *Attorney, Agent, or Firm* — Sughrue Mion, PLLC

(57) ABSTRACT

Possible to form an opening having a sufficient opening diameter in a region sandwiched between a pair of bit lines and thereby provide a semiconductor device in which a high-quality contact using the opening is formed.
The semiconductor device includes a first conductive layer, a first interlayer insulating film, a bit line, a first insulating film, a second interlayer insulating film, and a second conductive layer. The first insulating film that covers a side surface of the bit line has a portion perpendicular to a main surface of a semiconductor substrate in a region lower than a position lower than an uppermost portion of the first insulating film by a thickness, in a direction along the main surface of the semiconductor substrate, of the first insulating film that covers the side surface of the bit line at a lowermost portion of the bit line.

8 Claims, 21 Drawing Sheets

(56) References Cited

U.S. PATENT DOCUMENTS

| | | |
|---|---|---|
| 7,105,882 B2 | 9/2006 | Inoue et al. |
| 7,247,537 B2 * | 7/2007 | Park ............................. 438/253 |
| 8,008,154 B2 * | 8/2011 | Noh et al. .................... 438/264 |
| 2002/0135072 A1 | 9/2002 | Han et al. |

* cited by examiner

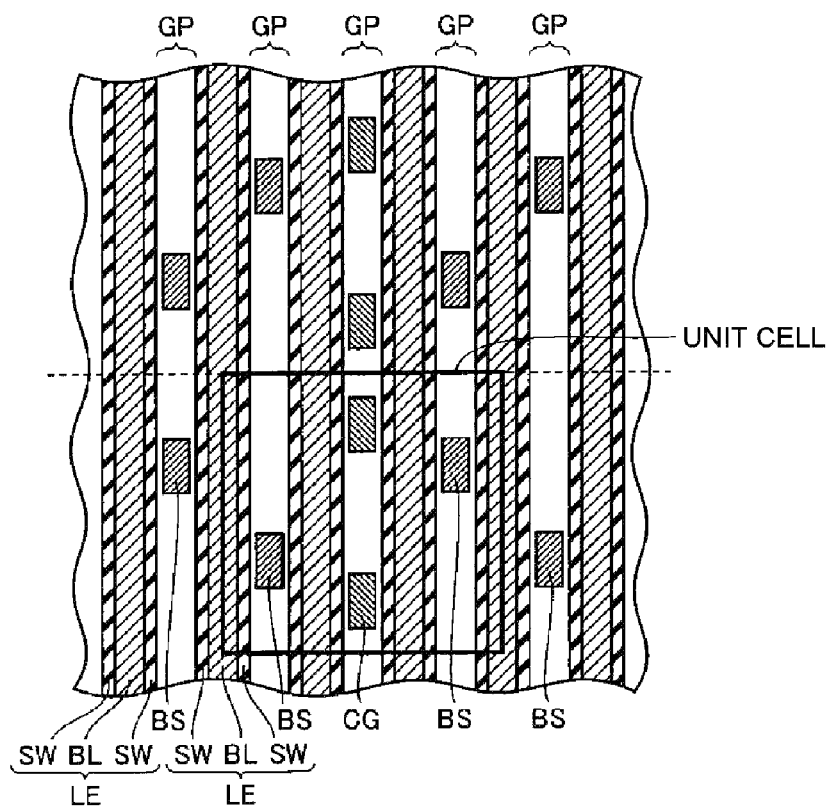
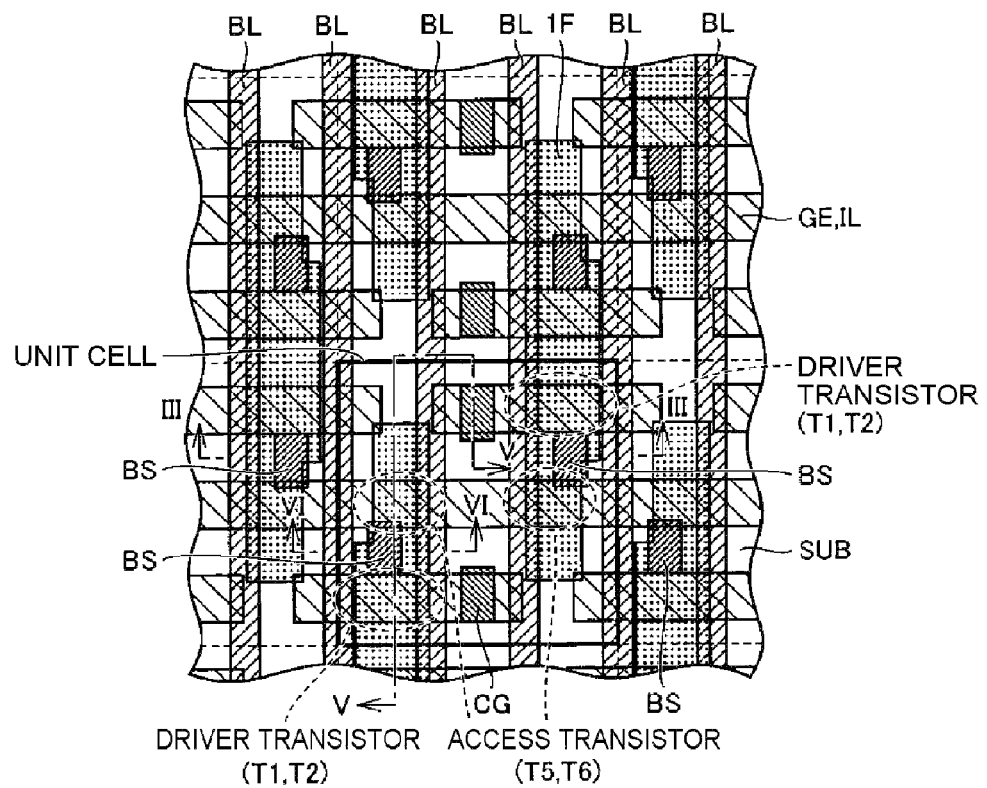

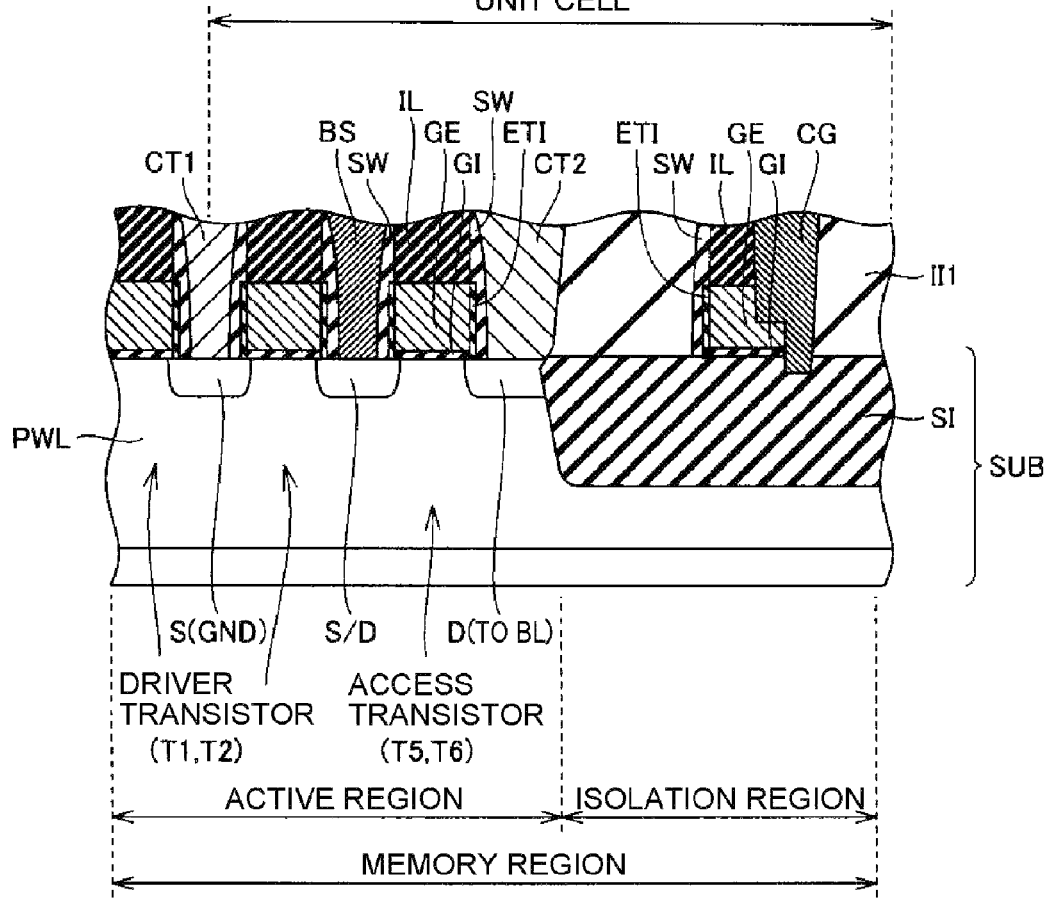

SEMICONDUCTOR DEVICE AND METHOD OF MANUFACTURING THE SAME

CROSS-REFERENCE TO RELATED APPLICATION

The disclosure of Japanese Patent Application No. 2013-007115 filed on Jan. 18, 2013 including the specification, drawings and abstract is incorporated herein by reference in its entirety.

BACKGROUND

The present invention relates to a semiconductor device and a method of manufacturing the same, for example, to a semiconductor device having fine bit lines and a method of manufacturing the same.

A plurality of fine elements constituting a semiconductor device tends to be increasingly multilayered to overlap with each other in a plan view due to high integration and miniaturization. With the multilayering of semiconductor devices, there is often used a technique in which a gate electrode of a transistor formed over a surface of a semiconductor substrate and a layer higher than the transistor are electrically coupled by a coupling layer called a plug and a conductive layer called a contact.

Furthermore, a region in which the contact can be formed, for example, a region between a pair of bit lines adjacent to each other with a gap therebetween, becomes narrow due to high integration and miniaturization. Therefore, when the region in which the contact is formed is shifted from a desired position, there is a probability that the shifted contact and a bit line adjacent to the contact cause a short circuit.

In order to prevent such a problem, an opening for forming the contact is increasingly formed by a technique called self-alignment that makes use of a difference in etching selectivity between materials of thin films to be formed instead of a conventional normal photolithography technique. The technique that forms the opening by the self-alignment is disclosed in, for example, Japanese Patent Laid-Open No. 2012-54342 (Patent Document 1), Japanese Patent Laid-Open No. 2010-40538 (Patent Document 2), and Japanese Patent Laid-Open No. 2011-77539 (Patent Document 3).

SUMMARY

The techniques disclosed in Patent Document 1 and Patent Document 2 use the self-alignment in order to form a contact in a region between a pair of gate lines adjacent to each other. When a method similar to these techniques is applied to bit lines, there is a probability that it is difficult to form an opening for forming a contact in a region sandwiched between a pair of bit lines.

Moreover, Patent Document 3 discloses that the short circuit is suppressed by covering an upper surface and a side surface of the bit lines through the use of an insulating film called a liner film. However, in this case, the liner film has to be removed eventually. When the liner film is removed, a short circuit may be caused between a contact and a bit line.

The other problems and the new feature will become clear from the description of the present specification and the accompanying drawings.

According to an embodiment, the semiconductor device includes a first conductive layer, a first interlayer insulating film, a bit line, a first insulating film, a second interlayer insulating film, and a second conductive layer. The first insulating film that covers a side surface of the bit line has a portion perpendicular to a main surface of a semiconductor substrate in a region lower than a position lower than an uppermost portion of the first insulating film by a thickness, in a direction along the main surface, of the first insulating film that covers the side surface of the bit line at a lowermost portion of the bit line.

According to another embodiment, in a method of manufacturing a semiconductor device, a first conductive layer, a first interlayer insulating film, and a bit line are formed over a main surface of a semiconductor device, and a first insulating film is formed so as to cover an upper surface and a side surface of the bit line and cover immediately above the first conductive layer. A second insulating film, whose material is different from that of the first insulating film, is formed so as to cover the bit line and the first insulating film. A part of the second insulating film is etched so as to remove the second insulating film immediately above the bit line and leave the second insulating film on a side wall of the first insulating film. A portion of the first insulating film located immediately above the first conductive layer is removed in a state in which the second insulating film is left on the side wall of the first insulating film. A second interlayer insulating film is formed so as to cover the first insulating film and the first conductive layer.

According to an embodiment, it is possible to form an opening having a sufficient opening diameter in, for example, a region sandwiched between a pair of bit lines and to provide a semiconductor device in which a high-quality contact using the opening is formed.

According to anther embodiment, a method of manufacturing a semiconductor device can form an opening having a sufficient opening diameter in, for example, a region sandwiched between a pair of bit lines and can provide a semiconductor device capable of forming a high-quality contact using the opening.

BRIEF DESCRIPTION OF THE DRAWINGS

FIG. 4A is a schematic plan view showing arrangement of bit lines, first plugs, and over-gate contacts in a part of a memory region. FIG. 4B is a schematic plan view showing entire arrangement of driver transistors and access transistors including the schematic plan view of FIG. 4A.

FIG. 5 is a schematic cross-sectional view taken along a line V-V in FIGS. 3 and 4A and 4B;

DETAILED DESCRIPTION

Hereinafter, an embodiment will be described on the basis of the drawings.

Figure 1:
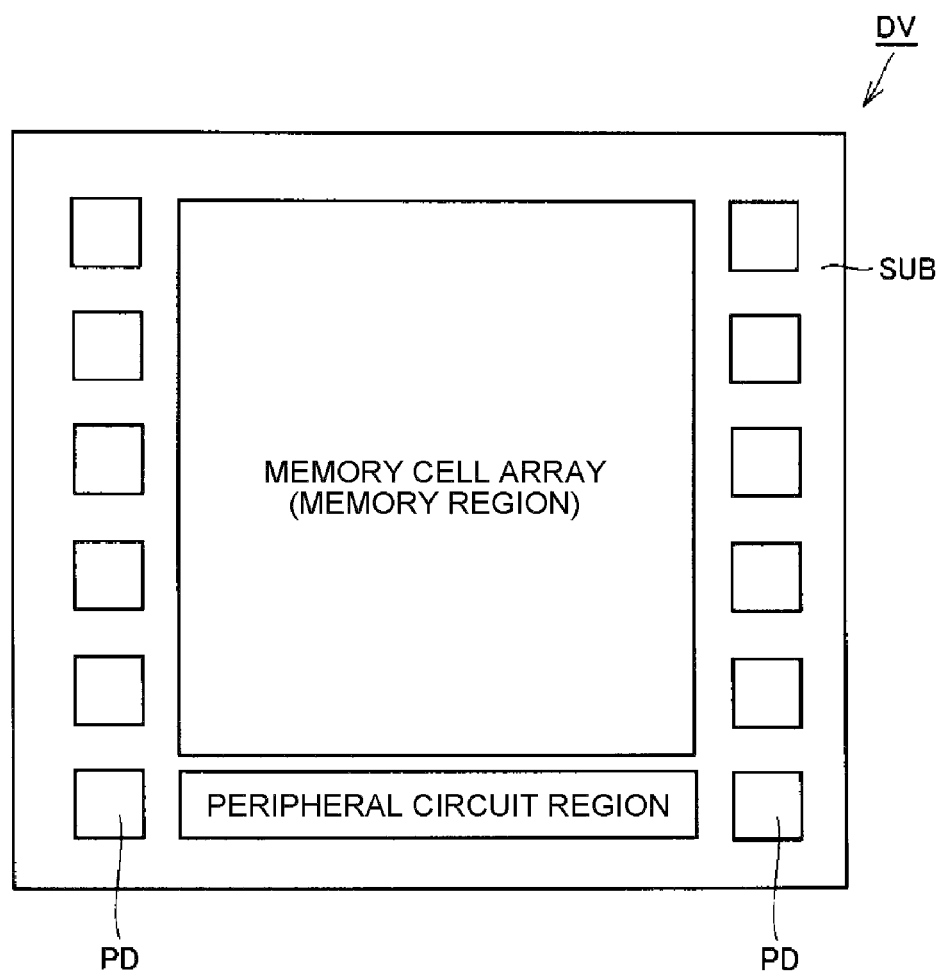
FIG. 1 is a schematic plan view of a semiconductor device according to an embodiment.

Referring to FIG. 1, a semiconductor device DV of the embodiment is, for example, a semiconductor chip in which a plurality of types of circuits is formed over a surface of a semiconductor substrate SUB such as a semiconductor wafer formed of a silicon single crystal. As an example, the semiconductor device DV has a memory cell array (memory region), a peripheral circuit region, and pad regions PD as circuits constituting the semiconductor device DV.

The memory cell array is a main memory region including an SRAM (Static Random Access Memory) of the semiconductor device DV. The peripheral circuit area and the pad regions PD are formed outside the memory cell array in a plan view. For example, a plurality of pad regions is formed outside the memory cell array with a gap between each of them.

Next, a configuration of the semiconductor device as the present embodiment will be described using a memory cell in FIG. 2.

Figure 2:
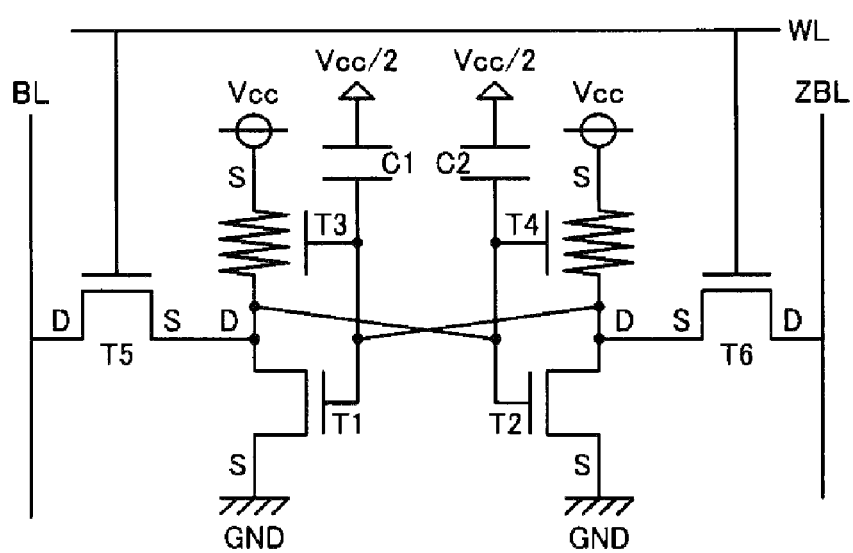
FIG. 2 is an equivalent circuit diagram of a memory cell constituting the semiconductor device according to the embodiment.

Referring to FIG. 2, the semiconductor device of the present embodiment has, as a memory cell, an SRAM including a bit line pair BL and ZBL, a word line WL, a flip-flop circuit, and a pair of access transistors T5 and T6.

The flip-flop circuit includes driver transistors T1 and T2 and load transistors T3 and T4. The driver transistor T1 and the load transistor T3 form one CMOS (Complementary Metal Oxide Semiconductor) inverter and the driver transistor T2 and the load transistor T4 form the other CMOS inverter. The flip-flop circuit includes these two CMOS inverters. The SRAM is a semiconductor storage device that does not need processing called refresh which restores charge accumulated as information at a predetermined period by having a flip-flop circuit. The SRAM of the present embodiment further includes capacitors C1 and C2 as DRAMs (Dynamic Random Access Memories).

The driver transistors T1 and T2 constituting the flip-flop circuit are, for example, n-channel type MOS transistors. The load transistors T3 and T4 are, for example, p-channel type TFTs (Thin Film Transistors). The access transistors T5 and T6 are, for example, n-channel type MOS transistors. In this way, the SRAM of the present embodiment is a so-called Advanced SRAM in which the load transistors are TFTs and the capacitors as DRAMs are added.

In the flip-flop circuit, the gate electrodes of the driver transistor T1 and the load transistor T3, and the capacitor C1, are electrically coupled to each other and these are electrically coupled to the source electrode S of the access transistor T6. The source electrode S of the access transistor T6 is electrically coupled to the drain electrodes D of the driver transistor T2 and the load transistor T4, and a region in which these are coupled functions as a first storage node section.

The gate electrodes of the driver transistor T2 and the load transistor T4, and the capacitor C2, are electrically coupled to each other and these are electrically coupled to the source electrode S of the access transistor T5. The source electrode S of the access transistor T5 is electrically coupled to the drain electrodes D of the driver transistor T1 and the load transistor T3, and a region in which these are coupled functions as a second storage node section.

The source electrodes S of the driver transistors T1 and T2 are electrically coupled to the GND potential and the source electrodes S of the load transistors T3 and T4 are coupled to a Vcc wiring (power supply wiring) respectively that applies a voltage Vcc. Further, the capacitors C1 and C2 are electrically coupled to a Vcc/2 wiring that applies a voltage Vcc/2, which is ½ of the above voltage Vcc. The pair of bit lines BL and ZBL are, respectively, coupled to the drain electrodes D of the pair of access transistors T5 and T6.

Next, a more specific configuration of the semiconductor device shown in FIG. 2 will be described using a schematic cross-sectional view in FIG. 3. However, the cross-sectional view in FIG. 3 is not a diagram showing an aspect in a specific region, but a diagram in which respective elements such as transistors and capacitors shown in FIG. 2 are collected in order to illustrate the shapes represented by these elements in the semiconductor device.

Figure 3:
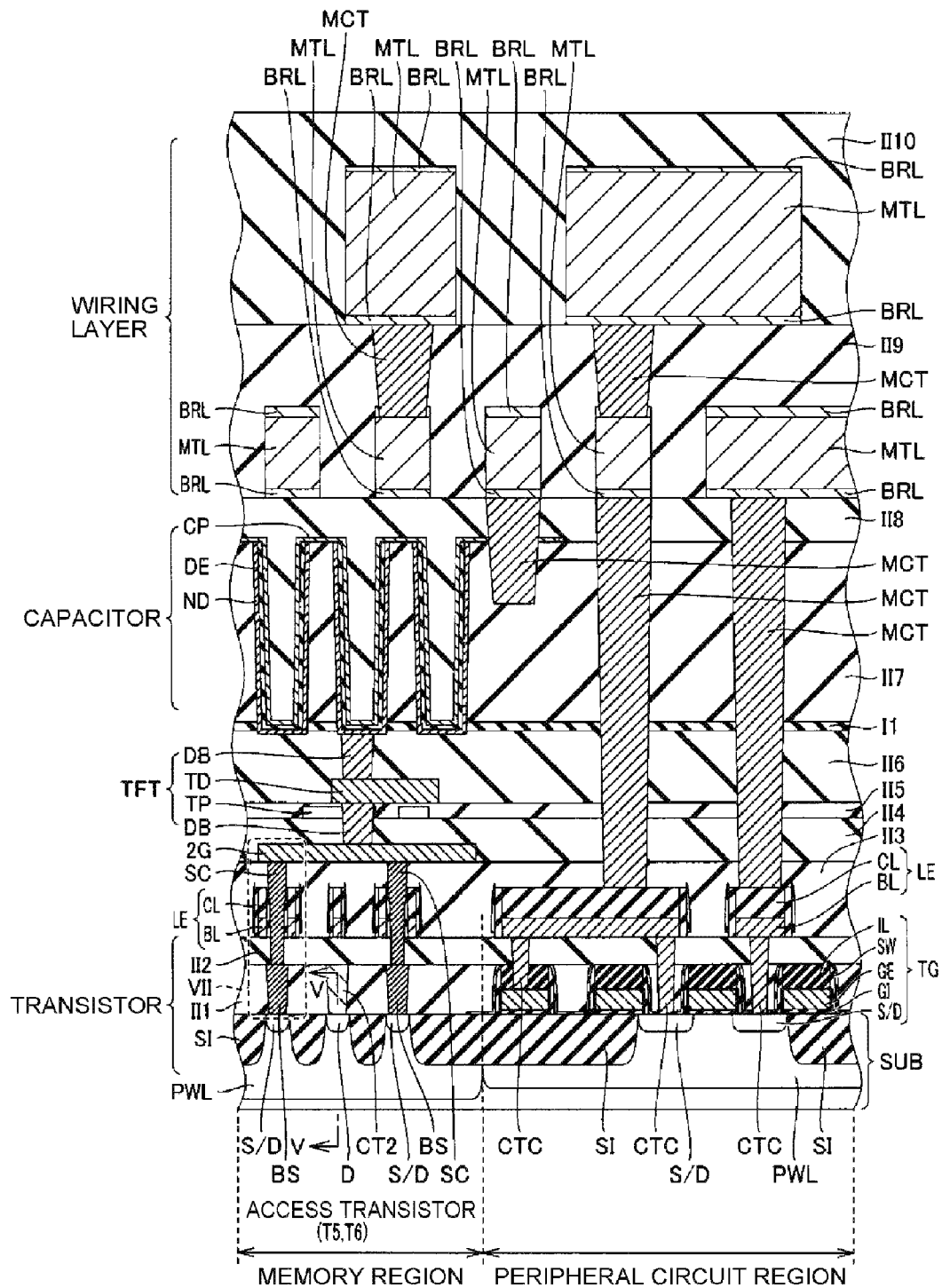
FIG. 3 is a schematic cross-sectional view for specifically illustrating the equivalent circuit in FIG. 2.

Referring to FIG. 3, for example, the semiconductor device of the embodiment is formed on one of main surfaces of an n-type semiconductor substrate SUB formed of, for example, a silicon single crystal.

The memory region and the peripheral circuit region are formed on the main surface of the semiconductor substrate SUB. The memory region is a region in which the SRAM (in particular, Advanced SRAM) in FIG. 1 is formed, and the peripheral circuit region is a region around the region in which the SRAM in FIG. 1 is formed and is a region in which, for example, a signal input/output circuit is formed. Meanwhile, the memory region in FIG. 3 is a schematic cross-sectional view of a portion taken along a line III-III in FIG. 4B.

The memory region includes isolation regions and active regions. STI (Shallow Trench Isolation) is formed as the isolation region on a part of the surface of the semiconductor substrate SUB. The STI is formed by burying an insulating layer SI in a groove formed on the surface of the semiconductor substrate SUB.

In the memory region, a region other than the isolation region where the STI is formed is a so-called active region. A plurality of active regions is formed on the surface of the semiconductor substrate SUB. For example, the active region is formed so as to be sandwiched between an isolation region formed on one end portion side of the active region and an isolation region formed on the other end portion side opposite to the one end portion side. In the active region, for example, there is formed a p-type well region PWL into which p-type conductive impurities are injected. In this case, one active region in the memory region and another active region adjacent to the one active region are electrically isolated from each other by an isolation region sandwiched between the one active region and the other active region.

A plurality of (n-type) MOS transistors is formed on the surface of the semiconductor substrate SUB in each active region and each of the transistors has a pair of source/drain regions S/D. For example, the regions S/D formed in the left-hand side active region and the right-hand side active region in FIG. 3 are regions in which the source region S of the access transistor and the drain region D of the driver transistor overlap with each other in a plan view and the access transistor and the driver transistor share the regions S/D. This is obvious by referring to FIG. 4B described later. In addition, the region D formed in the central active region in FIG. 3 is the drain region D of the access transistors T5 and T6 and is coupled to the bit line BL as described later, although not shown in FIG. 3.

An interlayer insulating film II1 formed of, for example, a silicon oxide film is formed so as to cover the main surface of the semiconductor substrate SUB in which the insulating layers SI described above and the like are formed. A plurality of first plugs BS (first conductive layers) is formed with a gap therebetween as the same layer as the interlayer insulating film II1. The first plug BS is formed by, for example, polycrystalline silicon to which conductive impurities are added and which fills the inside of an opening formed in a partial region of the interlayer insulating film II1. The first plug BS is formed so as to penetrate the interlayer insulating film II1 to thereby reach a pair of source/drain regions S/D on the main surface of the semiconductor substrate SUB.

In addition, a contact CT2 is formed as the same layer as the interlayer insulating film II1 in the memory region. In the same manner as the first plug BS, the contact CT2 is formed by, for example, polycrystalline silicon to which conductive impurities are added and which fills the inside of an opening formed in a partial region of the interlayer insulating film II1, and is formed so as to penetrate the interlayer insulating film II1 to thereby reach, for example, the drain region D on the main surface of the semiconductor substrate SUB.

An interlayer insulating film II2 (first interlayer insulating film) formed of, for example, a silicon oxide film is formed over the interlayer insulating film II1, that is, over the first plug BS, and for example, an interlayer insulating film II3 is formed so as to be in contact with the upper surface of the interlayer insulating film II2. In addition, over the insulating film II3, interlayer insulating films 114, 115, and 116 formed of, for example, a silicon oxide film are sequentially formed. Furthermore, an interlayer insulating film II formed of, for example, a silicon nitride film is formed so as to be in contact with the upper surface of the interlayer insulating film II6. Moreover, interlayer insulating film II7, II8, II9, and II10 formed of, for example, a silicon oxide film are sequentially formed so as to be in contact with the upper surface of the interlayer insulating film U.

A plurality of bit lines BL (for example, five bit lines BL) is formed, with a gap therebetween, over the interlayer insulating film II2 (so as to be in contact with the upper surface of the interlayer insulating film II2). The bit lines BL extend in a depth direction of the page of FIG. 3. A coated insulating film CL (first insulating film) is formed so as to cover the upper surface and the side surface of the bit line BL, and a wiring structure LE including the bit lines BL and the coated insulating films CL is formed.

The bit lines BL are electrically coupled to, for example, the drain region D of the access transistors T5 and T6 located at the center of the memory region in FIG. 3 by, for example, a contact conductive layer not shown in the drawings.

The interlayer insulating film II3 (second interlayer insulating film) is formed so as to cover the interlayer insulating film II2 and the wiring structure LE, and a lower layer wiring 2G is formed over the interlayer insulating film II3. The lower layer wiring 2G is a wiring arranged for electrically coupling a capacitor formed in a higher layer and a transistor formed in a lower layer by, for example, a second plug SC (second conductive layer). The lower layer wiring 2G is preferably formed in a region substantially overlapping with the capacitor in a plan view. The lower layer wiring 2G is preferably formed of, for example, a polycrystalline silicon film including impurity ions. Furthermore, when the transistor formed in the lower layer is, for example, an n-channel type transistor, the lower layer wiring 2G may be formed of, for example, polycrystalline silicon including n-type impurity ions in order to facilitate electrical coupling with the transistor TG.

A polycrystalline silicon layer TP is formed over the interlayer insulating film II4. The polycrystalline silicon layer TP is a semiconductor layer formed of polycrystalline silicon to which impurity ions are introduced, and includes a TFT channel region as the load transistors T3 and T4 of the SRAM (see FIG. 2) and a pair of source/drain regions sandwiching the channel region. In addition, the polycrystalline silicon layer TP includes a part of a power supply wiring for supplying power to the TFT. The polycrystalline silicon layer TP is preferably formed in a region substantially overlapping with the capacitor in a plan view.

A gate electrode layer TD of the TFT is formed over the interlayer insulating film II5. The gate electrode layer TD is preferably a semiconductor layer including polycrystalline silicon including impurity ions.

It is preferable that the gate electrode layer TD and the lower layer wiring 2G are electrically coupled by a conductive layer called a data node contact DB. While the data node contact DB extends from the gate electrode layer TD to the lower layer wiring 2G, the DB comes into contact with an end portion of the polycrystalline silicon layer TP and is electrically coupled to the polycrystalline silicon layer TP. The data node contact DB is a conductive layer for forming a flip-flop circuit (cross couple) of the SRAM and is formed of, for example, a semiconductor layer including polycrystalline silicon including impurity ions in the same manner as the gate electrode layer TD. The data node contact DB is preferred to be formed to extend in a direction substantially perpendicular to the surface of the semiconductor substrate SUB so as to penetrate the interlayer insulating films from the gate electrode layer TD to the lower layer wiring 2G.

The data node contact DB may be formed to electrically couple layers higher than or equal to the gate electrode layer TD, for example, the gate electrode layer TD and the capacitor, and may be formed to electrically couple layers lower than or equal to the lower layer wiring 2G, for example, the lower layer wiring 2G and the first plug BS. In this case, for example, the data node contact DB may be formed so as to penetrate the gate electrode layer TD, the polycrystalline silicon layer TP, and the lower layer wiring 2G from the capacitor, to thereby reach the first plug BS.

The capacitor is formed over the interlayer insulating film II6. The capacitor is in contact with the upper surface of the data node contact DB, and thus electrically coupled to the data node contact DB.

A metal wiring MTL is formed, above the capacitor, for example, over the interlayer insulating film II8 and the interlayer insulating film II9. The metal wiring MTL is formed of, for example, aluminum, alloy of aluminum and copper, copper, and tungsten, and it is preferable that the upper surface and the lower surface of the metal wiring MTL is covered by a barrier metal BRL formed of, for example, tantalum, titanium, and titanium nitride. It is preferable that the coupling between the metal wirings MTL described above, and the coupling between the metal wiring MTL and the bit line BL are performed by a metal contact conductive layer MCT formed of, for example, copper, tungsten, and the like.

In contrast, in the peripheral circuit region, for example, an n-type well region NWL into which n-type conductive impurities are injected is formed. However, the well region may be a p-type well region PWL. The peripheral circuit region also includes isolation regions and active regions in the same manner as the memory region. STI formed of an insulating layer SI is formed on a part of the surface of the semiconductor substrate SUB in the isolation region. A plurality of (p-type) MOS transistors TG is formed on the surface of the semiconductor substrate SUB in the active region. The transistor TG includes a pair of source/drain regions S/D, a gate insulating film GI, a gate electrode GE, and an insulating film IL. Each of the pair of source/drain regions S/D is formed in the surface of the semiconductor substrate SUB. The gate insulating film GI is formed over the surface of the semiconductor substrate SUB sandwiched between the pair of source/drain regions S/D. The gate electrode GE and the insulating film IL are formed over the gate insulating film GI and have a laminated structure of the gate electrode GE and the insulating film IL. The gate electrode GE has a so-called polycide structure in which, for example, polycrystalline silicon and tungsten silicide (WSi) are laminated. The insulating film IL is formed of, for example, a silicon oxide film and/or a silicon nitride film and serves as an etching stopper film when performing so-called self-alignment processing using the insulating film IL as a mask. Aside wall-insulating film SW is formed on the side walls of the gate electrode GE and the insulating film IL. In the same manner as the insulating film IL, the side wall-insulating film SW also serves as an etching stopper film when performing so-called self-alignment processing using the side wall-insulating film SW as a mask. It is preferable that the side wall-insulating film SW is formed of, for example, a silicon nitride film. However, the side wall-insulating film SW may be a combination of a silicon oxide film and a silicon nitride film.

Meanwhile, although the insulating film IL is formed over the gate electrode GE in FIG. 3, the gate electrode GE is electrically coupled to another wiring in a region extending in a depth direction of the page, which is not shown in the cross-sectional view in FIG. 3. Although detailed description is omitted, each transistor TG in the peripheral circuit region is electrically coupled to the metal wiring MTL via a contact conductive layer CTC, a conductive layer as the same layer as the bit line BL, the metal contact conductive layer MCT, and the like.

Next, referring to FIGS. 4 and 5, there will be described in more detail, in particular, the form of the layer in which the transistor TG is formed, in the semiconductor device shown in FIG. 3.

Referring to FIGS. 4A and 4B, the diagrams illustrate, from different viewpoints, aspects of the bit lines BL, the first plugs BS, and the like in the same region in the memory region of the semiconductor device in FIG. 3. In addition, in the ranges shown in FIGS. 4A and 4B, a pattern of each element is arranged symmetrically with respect to a straight line (indicated by a dashed line) extending in the horizontal direction at the central position with respect to the vertical direction in the figures. Furthermore, in the region lower than the straight line (indicated by a dashed line), there is repeated, in a plan view, a pattern of each element in a unit cell, in terms of a unit cell surrounded by a rectangular shape in the figures.

Referring to FIG. 4A, a plurality of bit lines BL extending in the vertical direction in the figure correspond to the bit lines BL extending in the depth direction of the page of FIG. 3, and the wiring structure LE is formed by forming the side wall-insulating film SW on the side surface of the bit line BL. A plurality of first plugs BS and a plurality of over-gate contacts CG are formed in a region sandwiched between a pair of bit lines BL adjacent to each other in the horizontal direction in the figures. Although the over-gate contact CG is formed over the gate electrode GE, the over-gate contact CG may be in contact with the gate electrode GE. Therefore, the over-gate contact CG is formed so as to structurally overlap with at least a part of the gate electrode GE in a plan view, and thus the over-gate contact CG and the gate electrode GE are electrically coupled and the over-gate contact CG is structurally coupled to the insulating layer SI in the isolation region.

In FIG. 4A, the bit lines BL (for example, six bit lines BL) extends (run side by side), with a gap therebetween, along a row direction or a column direction, and five regions, each of which is sandwiched between a pair of bit lines BL, are shown. The over-gate contacts CG are formed, with a gap therebetween, in the central region among the five regions, each of which is sandwiched between a pair of bit lines BL, in the vertical direction of the figure, and the first plugs BS are formed, with a gap therebetween, in the regions other than the central region in the vertical direction of the figure.

Referring to FIG. 4B, a plurality of active regions 1F is formed with a gap therebetween on the surface of the semiconductor device SUB in the memory region. Here, each active region 1F extends in the substantially vertical direction in FIG. 4B (in the depth direction of the page of FIG. 3). A plurality of gate electrodes GE are formed with a gap therebetween so as to intersect with (for example, cross perpendicularly) these active regions 1F in a plan view. The gate electrodes GE and the insulating films IL immediately above the gate electrodes GE constitute the transistors in FIG. 3 (the driver transistors T1 and T2 and the access transistors T5 and T6 in FIG. 2).

For example, in the unit cell surrounded by a rectangular shape in FIG. 4B, three-row gate electrodes GE (transistors) are arranged in the vertical direction in FIG. 4B. The upper gate electrode GE and the lower gate electrode GE among the three-row gate electrodes GE are divided into the gate electrodes GE in the horizontal direction in FIG. 4B, and independent driver transistors T1 and T2 are formed for each divided gate electrode GE. In addition, the central gate electrode GE among the three-row gate electrodes continues without being divided in the horizontal direction in FIG. 4B, and the access transistors T5 and T6 are formed here.

Specifically, the driver transistors T1 and T2 are formed in a region which is surrounded by a dashed-circle line in FIG. 4B and in which the gate electrode GE divided in the substantially horizontal direction in FIG. 4B and the active region 1F overlap with each other in a plan view. The access transistors T5 and T6 are formed in a region which is surrounded by a dashed-circle line in FIG. 4B and in which the gate electrode GE that continues in the substantially horizontal direction in FIG. 4B and the active region 1F overlap with each other in a plan view, and these access transistors T5 and T6 share the gate electrode GE (see FIG. 2).

The first plug BS is formed between a pair of bit lines BL so that the first plug BS strides across a pair of driver transistors T1 and T2 and a pair of access transistors T5 and T6, adjacent to each other in substantially the active region 1F. In addition, in substantially the active region 1F, the over-gate contact CG is formed over the gate electrode GE of the driver transistors T1 and T2 in a region in which the gate electrode GE of the driver transistors T1 and T2 and the isolation region overlap with each other and which is sandwiched between a pair of bit lines BL.

The interlayer insulating film II1 and the layer below the interlayer insulating film II1 in a portion along the active region 1F extending in one unit cell in FIG. 4B have an aspect shown in FIG. 5. Referring to FIG. 5, the driver transistors and the access transistors are arranged in this order from left to right in FIG. 5 in the active region in the unit cell. These transistors correspond to the driver transistors and the access transistors arranged from the lower side to the upper side of a portion along a bending V-V line in the unit cell in FIG. 4B. The driver transistors T1 and T2 and the access transistors T5 and T6 in FIG. 5 include the source/drain region S/D (a part of the region is shared by a pair of transistors adjacent to each other), the gate insulating film GI, the gate electrode GE, the insulating film IL, and the side wall-insulating film SW. The first plug BS is formed in a region sandwiched between the driver transistors and the access transistors in the active region in FIG. 5. Driver transistors T1 and T2 adjacent to the driver transistors T1 and T2 in the unit cell are partially illustrated outside the unit cell of FIG. 5.

In the isolation region in FIG. 5, the gate electrode GE corresponding to a region in which the gate electrode GE and the over-gate contact CG overlap each other on the V-V line in FIG. 4B is formed, and this is a part of a region of a driver transistor including the gate electrode GE, the gate insulating film GI, the insulating film IL, and the side wall-insulating film SW. The over-gate contact CG may be formed so as to cover not only the upper surface of the gate electrode GE but also both upper surfaces of the gate electrode GE and the insulating layer SI. The side surfaces of the gate insulating film GI and the gate electrode GE of the transistor may be covered by an additional insulating film ETI. The additional insulating film ETI is formed in order to alleviate electric field near the region and is preferable to be formed of, for example, a silicon oxide film.

Driver transistors are arranged on the left-hand side of (in FIG. 4B, in a region below) the driver transistors in the active region in FIG. 5, and the contact CT1 is formed between the driver transistors arranged on the left-hand side and the driver transistors adjacent to these driver transistors (on the leftmost side in the unit cell). Furthermore, a contact CT2 is formed between the access transistors in the active region and the interlayer insulating film II1 in the isolation region.

The contact CT1 is formed immediately above the source region S so as to be in contact with the upper surface of the source region S shared by both transistors on the right-hand side and left-hand side of the contact CT1. Referring to FIG. 2 again, the source region S is coupled to the ground region GND.

In contrast, the contact CT2 in FIG. 5 corresponds to the contact CT2 on the V-V line in FIG. 3 and is electrically coupled to the drain region D of the access transistors. Although not shown in FIGS. 3 and 5, for example, in a region extending in a depth direction of the page, which is not shown in the cross-sectional view in FIG. 3, the contact CT2 electrically couples the drain region D of the access transistor and the bit line BL through the contact conductive layer CTC (see FIG. 2 again).

Meanwhile, the over-gate contact CG and the contact CT1 described above are formed by, for example, polycrystalline silicon to which conductive impurities are added in the same manner as the first plug BS and the contact CT2. However, here, as described later, the first plug BS is a conductive layer coupled to the second plug SC and the contacts CT1 and CT2 are conductive layers that are not coupled to the second plug SC, and thus the first plug BS is distinguished from the contacts CT1 and CT2.

The semiconductor device of the embodiment basically has the configuration described above. Next, a configuration of the bit lines BL and a region near the bit lines BL in the semiconductor device of the embodiment will be described in more detail with reference to FIGS. 6 to 10.

Figure 6:
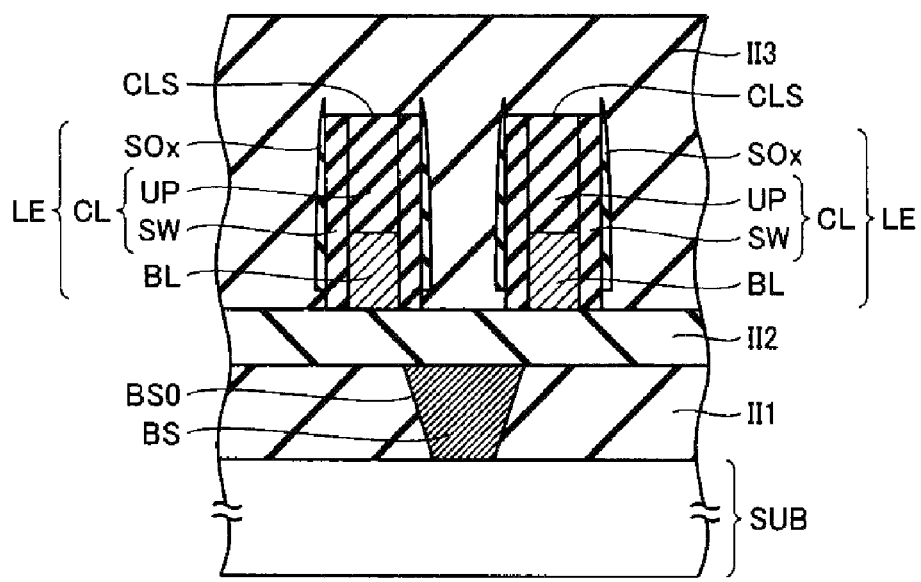
FIG. 6 is a schematic cross-sectional view showing a configuration of bit lines and a region near the bit lines according to the embodiment.

Referring to FIG. 6, here, two wiring structures LE adjacent to each other are extracted from among a plurality of (five) wiring structures LE arranged with a gap therebetween in FIG. 3 and are shown in more detail than FIGS. 3 and 4B (so that, for example, the side wall-insulating film SW or the like on the side surface of the bit line BL, which is omitted in FIG. 4B, is included).

The wiring structure LE includes the bit line BL, the coated insulating film CL (first insulating film), and an additional side wall-insulating film SOx (second insulating film). The bit line BL extends in the depth direction of the page of FIG. 6 and a cross-section intersecting the extending direction has a rectangular shape (for example, an oblong shape). The bit line BL is formed by, for example, tungsten. The coated insulating film CL is constituted by an upper insulating film UP and the side wall-insulating film SW. The upper insulating film UP is formed so as to cover the upper surface of the bit line BL and the side wall-insulating film SW is formed so as to cover the side surface of the bit line BL. The coated insulating film CL together with the upper insulating film UP and the side wall-insulating film SW is formed by, for example, a silicon nitride film. In addition, as shown in FIG. 6, it is configured such that the upper insulating film UP covers only the upper surface of the bit line BL and the side wall-insulating film SW covers only the side surface of the bit line BL (and the upper insulating film UP). These insulating films UP and SW may be films independent from each other. Furthermore, these insulating films UP and SW may be collectively defined as the coated insulating film CL.

The additional side wall-insulating film SOx is an insulating film formed so as to cover at least a part of the side surface of the bit line BL, more correctly, the side surface of the side wall-insulating film SW.

The interlayer insulating film II3 is formed so as to cover the wiring structure LE of the bit line having the configuration described above, and thus a region sandwiched between a pair of the wiring structures LE shown in FIG. 6 is filled with the interlayer insulating film II3.

Meanwhile, the first plug BS is arranged substantially immediately below a region sandwiched between a pair of bit lines BL (wiring structures LE). The first plug BS is formed in a part of the interlayer insulating film II1 by, for example, polycrystalline silicon that fills the inside of an opening BS0 (that reaches from the upper surface of the interlayer insulating film II1 to the lower surface facing the upper surface).

Meanwhile, although not shown in the drawings, it is preferable that a barrier metal such as titanium nitride (TiN) and titanium (Ti) is formed so as to be in contact with the lower surface of the bit line BL (that is, so as to be in contact with the upper surface of the interlayer insulating film II2). Here, the bit line BL includes the barrier metal.

Figure 7:
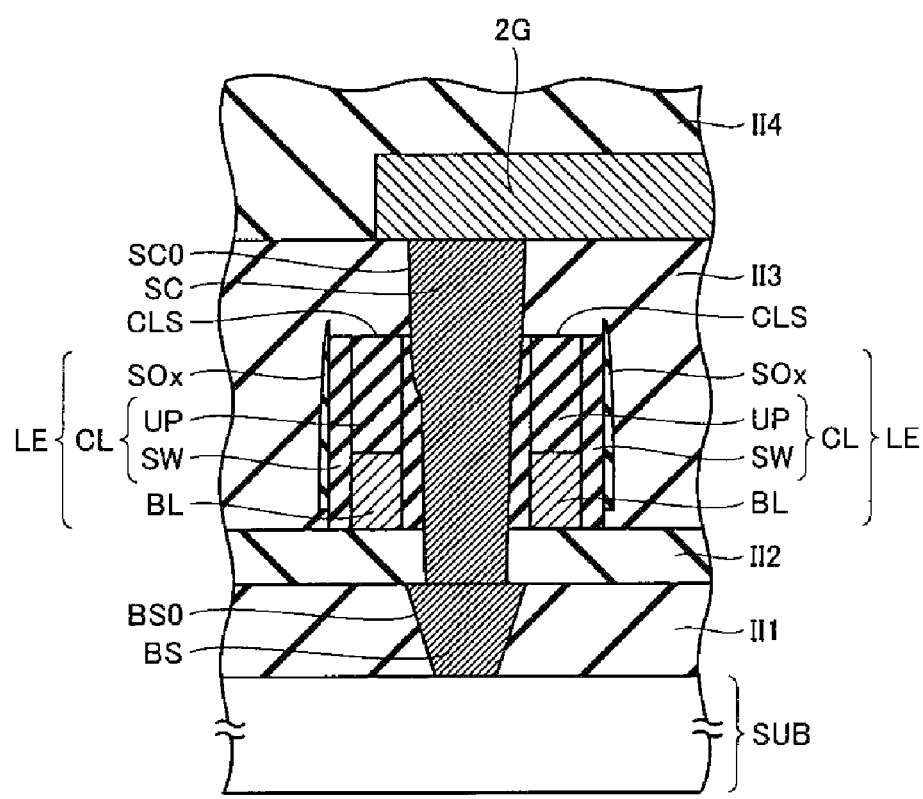
FIG. 7 is a schematic cross-sectional view showing the configuration of bit lines and a region near the bit lines according to the embodiment in more detail than FIG. 6.

FIG. 7 shows an aspect in which the second plug SC is formed in a region sandwiched between a pair of bit lines BL in FIG. 6 and shows the same region as the region VII surrounded by a dashed-circle line in FIG. 3. Referring to FIG. 7, the second plug SC is formed in a region sandwiched between a pair of bit lines BL adjacent to each other. The second plug SC penetrates the interlayer insulating film II3 and the interlayer insulating film II2 below the interlayer insulating film II3 from the upper surface of the interlayer insulating film II3, reaches the upper surface of the first plug BS, and is coupled to the first plug BS.

The second plug BS is formed by, for example, polycrystalline silicon to which conductive impurities are added and which fills the inside of a contact hole SC0. The contact hole SC0 is formed between a pair of bit lines BL adjacent to each other so as to penetrate the interlayer insulating film II3 and the interlayer insulating film II2 from the upper surface of the interlayer insulating film II3, to thereby reach the upper surface of the first plug BS.

Figure 8:
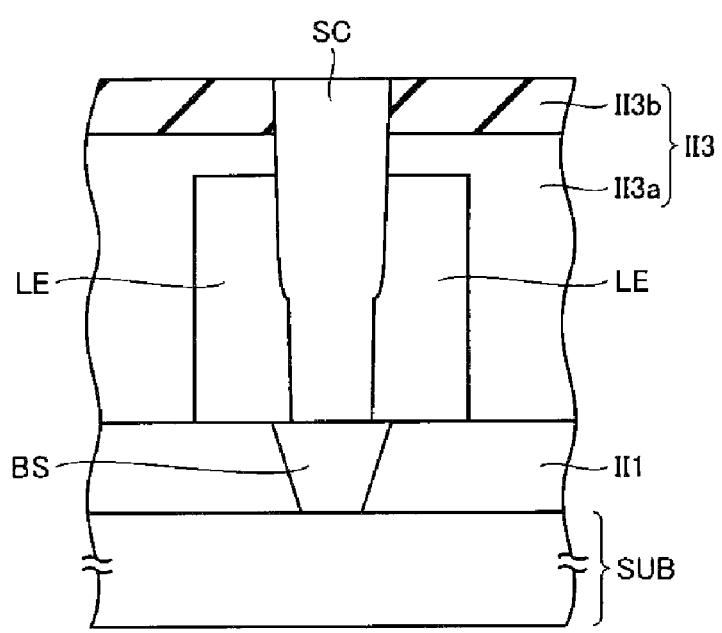
FIG. 8 is a schematic cross-sectional view showing a configuration of an interlayer insulating film II3 in detail.

The interlayer insulating film II3 may be also formed by, for example, silicon oxide film in the same manner as the other interlayer insulating films. However, as shown in FIG. 8, it is preferable that the interlayer insulating film II3 has a configuration in which a first region II3a formed of a silicon oxide film called BPTEOS including impurities such as boron and phosphorus and a second region II3b formed of a silicon oxide film that can form a normal silicon oxide film ($SiO_2$) (not including conductive impurities) formed by an organic material called TEOS (Tetra Ethyl Ortho Silicate) are laminated as shown in FIG. 8. The properties such as an etching selectivity of the first region II3a formed of BPTEOS are different from those of a normal silicon oxide film ($SiO_2$) (not including conductive impurities). In this case, it is more preferable that the first region II3a has a thickness capable of covering the wiring structure LE. In addition, a silicon oxide film having properties of glass called so-called NSG (None-doped Silicate Glass) and PSG (Phospho-Silicate Glass) may be used as the interlayer insulating film II3.

Referring to FIGS. 6 and 7 again, the side surface (outer surface in FIG. 6) of the side wall-insulating film SW constituting the coated insulating film CL has a portion perpendicular to the main surface of the semiconductor substrate SUB and extends in the vertical direction in FIG. 6. That is, the cross-sectional shape of the structure including the bit line BL, the upper insulating film UP, and the side wall-insulating film SW is a rectangular shape including a surface along the main surface of the semiconductor substrate SUB and a surface perpendicular to the main surface of the semiconductor substrate SUB.

Figure 9:
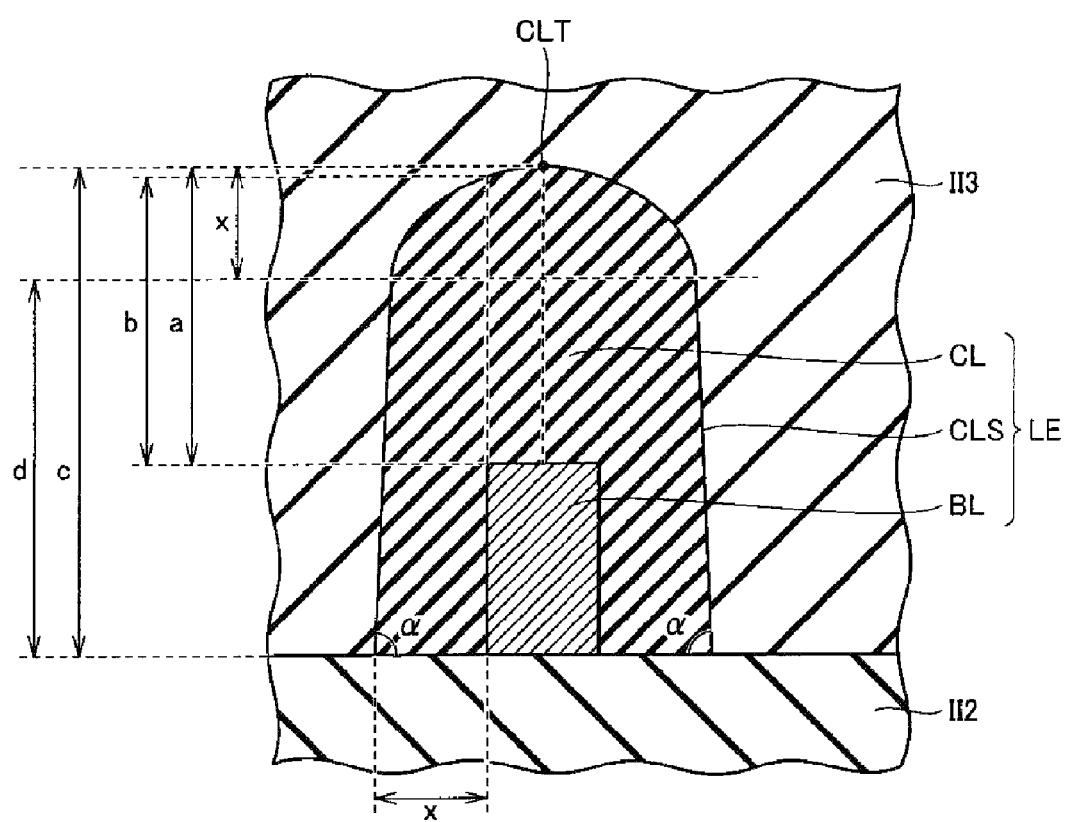
FIG. 9 is a schematic diagram for accurately illustrating a cross-sectional shape and dimensions of a wiring structure of the embodiment.

Next, the above-described "perpendicular" will be more specifically defined using FIG. 9.

Referring to FIG. 9, the thickness of the coated insulating film CL that covers the side surface of the bit line BL at the lowest portion of the bit line BL (a portion in contact with the interlayer insulating film II2) is defined as x. In addition, the outermost surface of the coated insulating film CL that covers the bit line BL is defined as a coated film surface CLS and the highest point of the coated film surface CLS is defined as a coated film uppermost portion CLT (first insulation film uppermost portion). The coated film uppermost portion CLT is formed, for example, at the central position of the bit line BL with respect to the width direction of the bit line BL (the width direction intersecting with the depth direction of the page in a plan view, in which the bit line BL extends, that is, the horizontal direction in FIG. 9). However, the coated film uppermost portion CLT may be formed at a position other than the central position.

Under the condition described above, when an angle α of the coated film surface CLS with respect to the main surface of the semiconductor substrate SUB is greater than or equal to 85°, the coated film surface CLS is defined to be perpendicular to the main surface of the semiconductor substrate SUB.

Here, in particular, the angle α of the entire coated film surface CLS lower than a position that is lower (lower side of FIG. 9 and closer to the semiconductor substrate SUB) than the coated film uppermost portion CLT by x with respect to the main surface of the semiconductor substrate SUB (the upper surface of the interlayer insulating film II2) is greater than or equal to 85° (perpendicular). However, a part of the coated film surface CLS higher than the position that is lower (lower side of FIG. 9 and closer to the semiconductor substrate SUB) than the coated film uppermost portion CLT by x may be perpendicular to the main surface of the semiconductor substrate SUB.

The length a in FIG. 9 indicates the maximum thickness of the coated insulating film CL that covers the upper surface of the bit line BL in a direction orthogonal to the main surface of the semiconductor substrate SUB, and indicates the distance between the coated film uppermost portion CLT and the upper surface of the bit line BL in a direction orthogonal to the main surface of the semiconductor substrate SUB. The length b in FIG. 9 indicates the thickness of the coated insulating film CL that covers the upper surface of the bit line BL at an end portion of the bit line BL with respect to the width direction (the left end or the right end of the bit line BL in FIG. 9) in a direction orthogonal to the main surface of the semiconductor substrate SUB. At this time, it is preferable that b is greater than or equal to 0.95 times a, that is, b≥0.95a.

The length d in FIG. 9 indicates the height of the bit line BL with respect to the lowest portion of the bit line BL (upper surface of the interlayer insulating film II2). Here, the height indicates a difference between positions in the direction orthogonal to the main surface of the semiconductor substrate SUB. The length c in FIG. 9 indicates the height of a portion of the coated film surface CLS perpendicular to the main surface of the semiconductor substrate SUB, that is, a difference of position between the highest portion of the portion of the coated film surface CLS perpendicular to the main surface of the semiconductor substrate SUB and the main surface of the semiconductor substrate SUB in the direction orthogonal to the main surface of the semiconductor substrate SUB. At this time, it is preferable that d is greater than or equal to 0.86 times c, that is, d≥0.86c.

Referring to FIG. 6 again, the silicon nitride film that forms the coated insulating film CL is not formed over the interlayer insulating film II2 in a region in which the bit line BL (wiring structure LE) is not formed (for example, in a region sandwiched between a pair of wiring structures LE). Referring to FIG. 4A again, the silicon nitride film is formed as the coated insulating film CL constituting the wiring structure LE. However, the silicon nitride film is not formed but removed across the entire portion in the longitudinal direction (row direction or column direction which is the vertical direction in FIG. 4A), in which the wiring structure extends, in a region GP (gap) sandwiched between a pair of wiring structures LE adjacent to each other. Specifically, in FIG. 4A, in a region in which the first plugs BS and the over-gate contacts CG are arranged in a row, the silicon nitride film constituting the coated insulating film CL is not formed across the entire portion in the vertical direction in FIG. 4A.

It is preferable that the additional side wall-insulating film SOx is formed of a material different from that of the coated insulating film CL, and specifically, it is preferable that the additional side wall-insulating film SOx is formed of, for example, a silicon oxide film. By this way, it is possible to secure the etching selectivity between the coated insulating film CL and the additional side wall-insulating film SOx and to make the coated insulating film CL to be an etching stopper for the additional side wall-insulating film SOx.

In addition, when etching the coated insulating film CL over the interlayer insulating film II2, the additional side wall-insulating film SOx serves as an etching stopper. Therefore, the side wall of the coated insulating film CL is protected and the side wall of the coated insulating film CL can be perpendicular to the main surface of the semiconductor substrate SUB.

Furthermore, it is preferable that the additional side wall-insulating film SOx is formed of a material different from that of the interlayer insulating film II3. For example, as described, it is preferable that the additional side wall-insulating film SOx is formed of a normal silicon oxide film ($SiO_2$) (not including conductive impurities), and that, in particular, the interlayer insulating film II3a constituting the interlayer insulating film II3 is formed by BPTEOS and the like. By this way, it is possible to secure the etching selectivity between the additional side wall-insulating film SOx and the interlayer insulating film II3a and make the additional side wall-insulating film SOx to be an etching stopper for the interlayer insulating film II3a.

For example, as shown in FIG. 6, it is preferable that the additional side wall-insulating film SOx projects higher than the uppermost portion of the upper insulating film UP that covers the upper surface of the bit line BL. The additional side wall-insulating film SOx is not in contact with the lowermost portion of the bit line BL and need not be formed to be in contact with the side surface of the bit line BL (side wall-insulating film SW) in a region from the lowermost portion of the bit line BL to a certain height in the vertical direction in FIG. 6.

Referring to FIG. 7 again, in particular, the contact hole SC0 is formed through etching, by the self-alignment processing, of the interlayer insulating film II3 in a region sandwiched between a pair of bit lines BL (wiring structures LE). This is because the gap between the bit lines BL adjacent to each other is very narrow due to miniaturization of semiconductor device.

Figure 10:
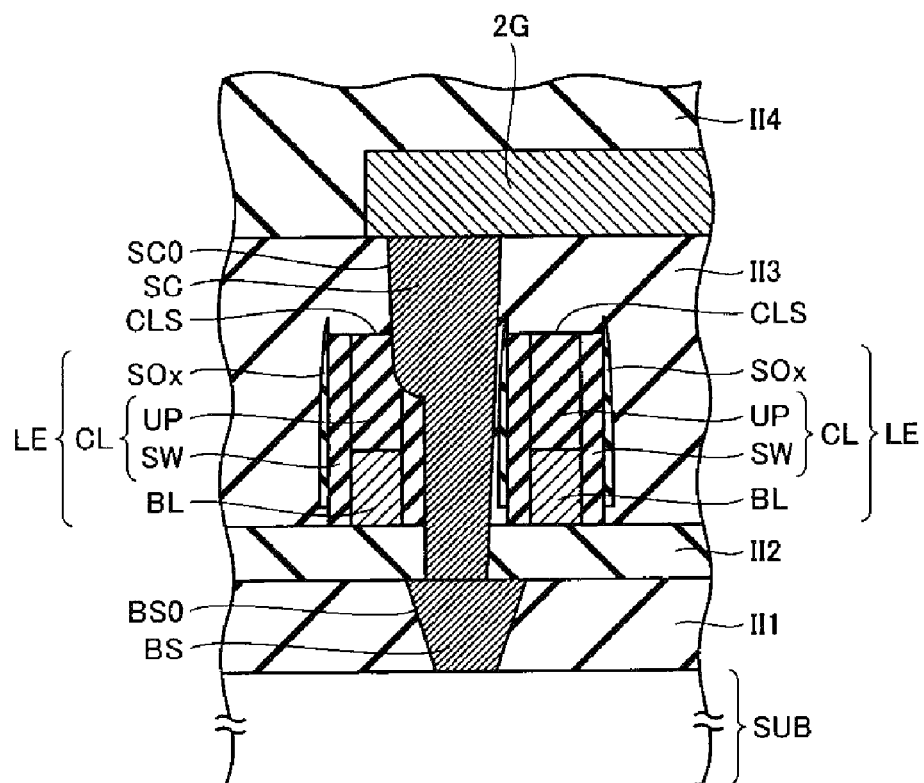
FIG. 10 is a schematic cross-sectional view showing a configuration of bit lines and a region near the bit lines when a position of a second plug is shifted with respect to FIG. 7.

FIG. 7 shows an aspect in which the contact hole SC0 is formed at a central position between a pair of bit lines BL with no deviation in the horizontal direction in FIG. 7, but as shown in FIG. 10, there may be cases where, for example, the contact hole SC0 is formed so as to be shifted to a side (left side in FIG. 10) on which any of the pair of bit lines BL is disposed.

Next, a method of manufacturing the semiconductor device of the embodiment will be described with reference to FIGS. 11 to 19. Meanwhile, here, there will be mainly described a method of forming the same layers as those of, in particular, the interlayer insulating films II1 to II3 in the memory region in FIG. 3.

Figure 11:
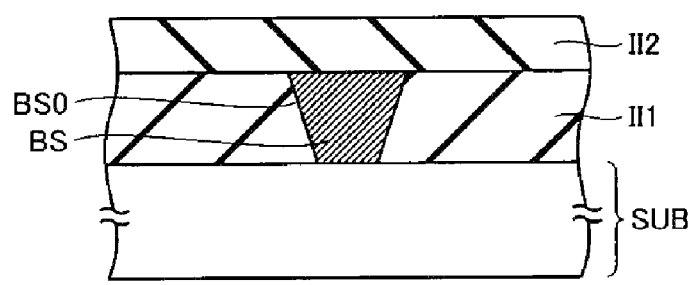
FIG. 11 is a schematic cross-sectional view showing a first process of a method of manufacturing the semiconductor device according to the embodiment.

Referring to FIG. 11, the semiconductor substrate SUB including the main surface is prepared and the insulating layer SI, the driver transistors, the access transistors, and the like in FIG. 3 are formed by a publicly known method, and thereafter, the interlayer insulating film II1 formed of a silicon oxide film is formed by using, for example, a CVD (Chemical Vapor Deposition) method so as to cover the insulating layer SI, the driver transistors, the access transistors, and the like. After that, the interlayer insulating film II1 is polished so that the upper surface becomes flat, by a chemical mechanical polishing method called CMP (Chemical Mechanical Polishing). Furthermore, by a normal photolithography technique and an etching technique, the opening BS0 is formed so that the opening BS0 penetrates the interlayer insulating film II1 and reaches a layer below the interlayer insulating film II1 (for example, a source region which is formed in the semiconductor substrate SUB and is not shown in the drawings). For example, the opening BS0 is for forming the first plug BS in a region sandwiched by the driver transistors and the access transistors in FIG. 5. Therefore, there may be formed openings for forming the contacts CT1, CT2 and the like in FIG. 5 at the same time as the opening BS0.

Next, there is filled inside the opening BS0, for example, a conductive film of polycrystalline silicon to which conductive impurities are added. In this processing, for example, the CVD method is used and a thin film of the polycrystalline silicon is also formed over the interlayer insulating film II1. The thin film of polycrystalline silicon over the interlayer insulating film II1 is removed by the CMP and etchback. In this way, the first plug BS is formed.

Thereafter, the interlayer insulating film II2 is formed over the interlayer insulating film II1 including the first plug BS.

Figure 12:
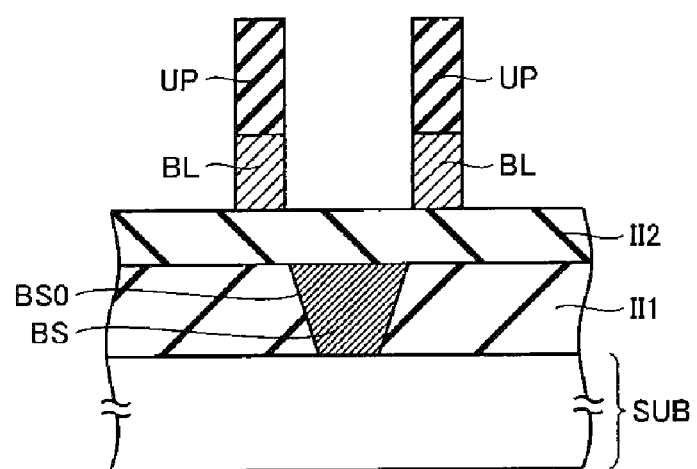
FIG. 12 is a schematic cross-sectional view showing a second process of the method of manufacturing the semiconductor device according to the embodiment.

Referring to FIG. 12, although not shown in FIG. 12, a barrier metal such as titanium nitride (TiN) and titanium (Ti), which are not shown, is formed over the interlayer insulating film II2 by, for example, a sputtering method, and thereafter, a thin film of tungsten is formed and further a silicon nitride film is formed over the thin film of tungsten by, for example, the CVD method. Next, a normal photolithography technique and etching are performed on these films. Therefore, a plurality of bit lines BL and insulating films UP, extending in the depth direction of the page of FIG. 12, is formed. The bit lines BL are formed with a gap therebetween in the horizontal direction, that is, in the width direction in FIG. 12, and it is preferable that the side surface of the bit line BL is formed to be substantially perpendicular to the surface of the interlayer insulating film II2.

Figure 13:
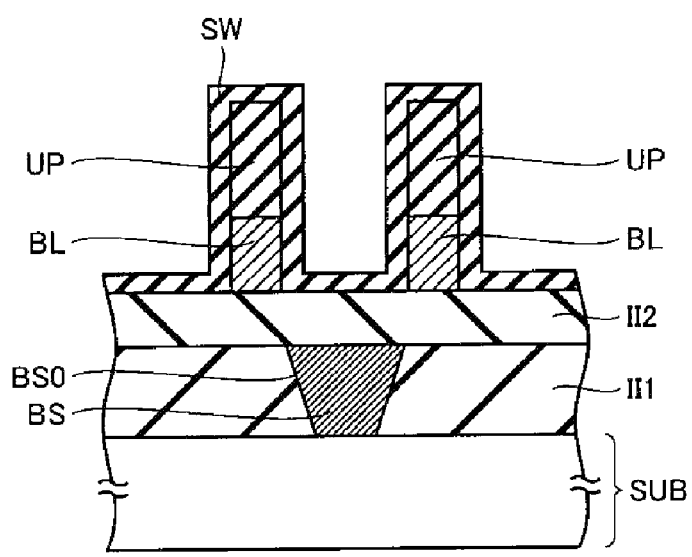
FIG. 13 is a schematic cross-sectional view showing a third process of the method of manufacturing the semiconductor device according to the embodiment.

Referring to FIG. 13, the insulating film SW formed of a silicon nitride film is formed so as to cover the upper surface and the side surface of the bit line BL and the insulating film UP and the upper surface (immediately above portion) of the interlayer insulating film II2 by, for example, the CVD method. Here, it is preferable that the insulating film SW that covers the side surface of the bit line BL is formed so as to be substantially orthogonal to the surface of the interlayer insulating film II2.

Figure 14:
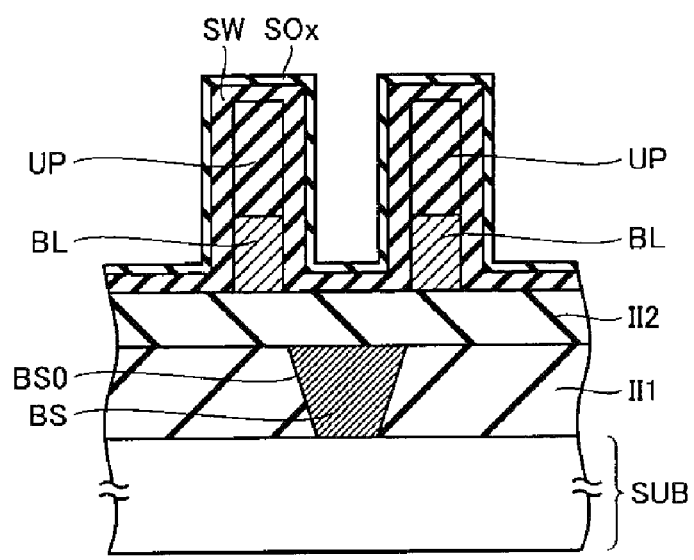
FIG. 14 is a schematic cross-sectional view showing a fourth process of the method of manufacturing the semiconductor device according to the embodiment.

Referring to FIG. 14, a material different from the insulating films UP and SW, for example, a silicon oxide film SOx is formed so as to cover the insulating film SW in FIG. 13 by, for example, the CVD method. It is preferable that the insulating film SOx formed here is a material whose etching selectivity with respect to the insulating films UP and SW is large.

Figure 15:
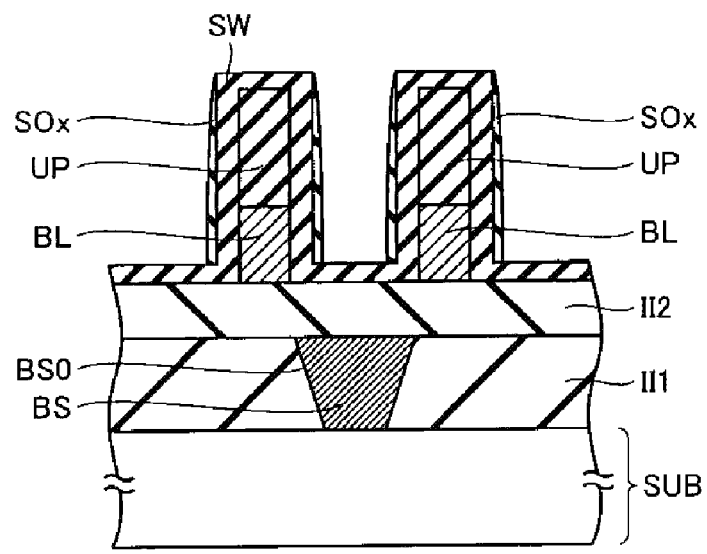
FIG. 15 is a schematic cross-sectional view showing a fifth process of the method of manufacturing the semiconductor device according to the embodiment.

Referring to FIG. 15, the insulating film SOx immediately above the bit line BL is removed and the insulating film SOx over the insulating film SW directly formed over the interlayer insulating film II2 located immediately above the first plug BS is removed by anisotropic etching. At this time, a part of the insulating film SOx is removed by etching so that the insulating film SOx on the side wall of the insulating film SW in contact with the side surface of the bit line BL remains.

Figure 16:
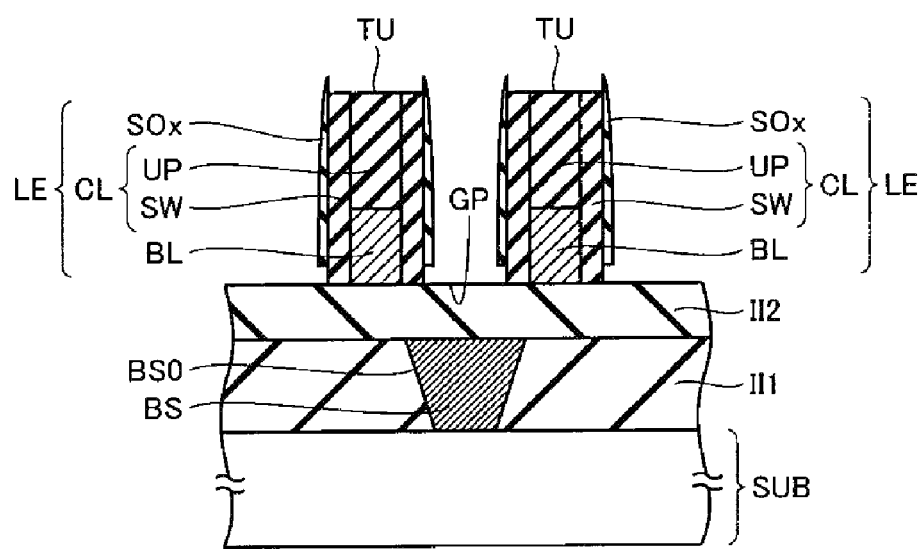
FIG. 16 is a schematic cross-sectional view showing a sixth process of the method of manufacturing the semiconductor device according to the embodiment.

Referring to FIG. 16, the insulating film SW immediately above the bit line BL and the insulating film SW directly formed over the interlayer insulating film II2 located immediately above the first plug BS are removed by isotropic etching. At this time, in a state in which the insulating film SOx on the side wall of the insulating film SW in contact with the side surface of the bit line BL remains, the insulating film SW is removed. At this time, the entire insulating film SW immediately above the bit line BL may be removed or a part of the insulating film SW immediately above the bit line BL may remain. In addition, the insulating film UP immediately above the bit line BL may be partially removed so that at least a part of the insulating film UP remains.

Figure 17:
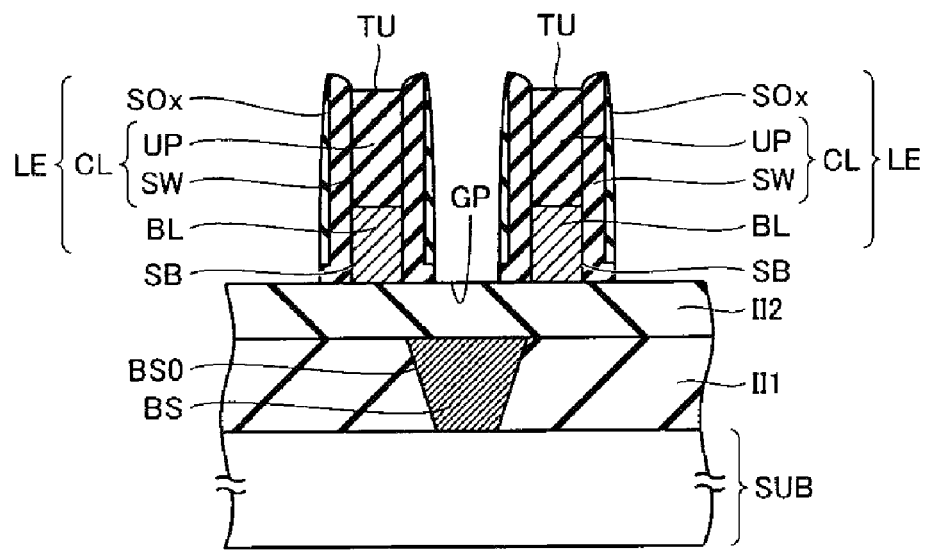
FIG. 17 is a schematic cross-sectional view showing the sixth process of the method of manufacturing the semiconductor device according to the embodiment as a modification of FIG. 16.

As a result of the isotropic etching, there is provided an aspect in which the insulating film SOx covers the side surface of the insulating film SW and projects higher than the uppermost portion TU of the insulating film UP. However, as shown in the modification of FIG. 17, the insulating film SW may be removed by the anisotropic etching. In this case, in the same manner as in FIG. 16, there is provided an aspect in which the insulating film SOx projects higher than the uppermost portion TU of the insulating film UP and a portion of the insulating film SW located immediately above a region outside the side surface SB of the bit line BL projects higher than (the uppermost portion TU of) a portion of the upper insulating film UP located immediately above the upper surface of the bit line BL. By the procedure described above, the wiring structure LE is formed in which the coated insulating film CL including the upper insulating film UP and the side wall-insulating film SW and the additional side wall-insulating film SOx are formed on the bit line BL.

In both FIGS. 16 and 17, a plurality of wiring structures LE of the bit line BL and the coated insulating film CL extends (run side by side), in a plan view, with a gap therebetween in the row direction or the column direction (see FIGS. 4A and 4B). In both FIGS. 16 and 17, it is preferable that all the insulating films SW formed in the region GP between a pair of wiring structures LE adjacent to each other are removed (across the entire portion in the longitudinal direction of the wiring structure LE, that is, in the depth direction of the page). In both FIGS. 16 and 17, the additional side wall-insulating film SOx is not formed in a region from the upper surface of the interlayer insulating film II2 to a certain height.

Figure 18:
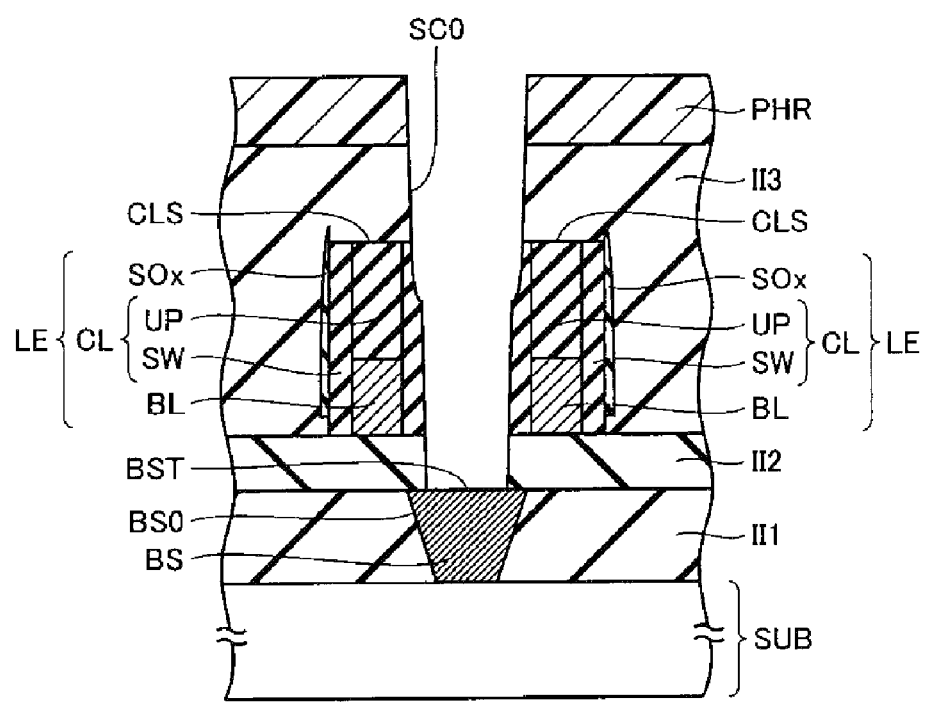
FIG. 18 is a schematic cross-sectional view showing a seventh process of the method of manufacturing the semiconductor device according to the embodiment, which follows FIG. 16.
Figure 19:
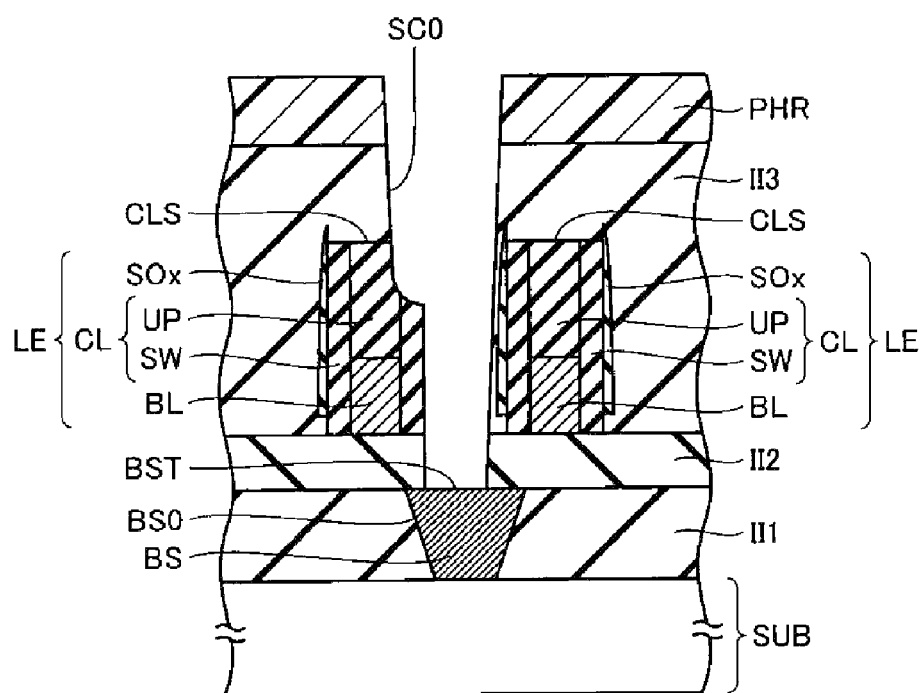
FIG. 19 is a schematic cross-sectional view showing an eighth process of the method of manufacturing the semiconductor device when the position of the second plug is shifted with respect to FIG. 18.

Referring to FIG. 18, the interlayer insulating film II3 is formed by the CVD method so as to cover the wiring structure LE in FIG. 16 or 17 (in FIGS. 18 and 19, the wiring structure LE of FIG. 16 is shown). As a result, the interlayer insulating film II3 is formed so as to cover the upper surface of the coated insulating film CL constituting the wiring structure LE and cover the first plug BS (the upper surface of the interlayer insulating film II2 immediately above the first plug BS). Here, it is preferable that the interlayer insulating film II3a, which is a part of the interlayer insulating film II3, is the first region II3a formed of, for example, BPTEOS so that the interlayer insulating film II3a is a material different from the additional side wall-insulating film SOx (normal silicon oxide film not including conductive impurities) as described above (see FIG. 8).

Next, there is formed the contact hole SC0 which penetrates the interlayer insulating film II3 and the interlayer insulating film II2 and reaches the first plug BS. Here, the contact hole SC0 is formed by the so-called self-alignment processing.

Specifically, first, there is formed a pattern of photoresist PHR having an opening immediately above a region in which the contact hole SC0 is to be formed, by a normal photolithography technique. The opening of the photoresist PHR may be formed so that the plane area of the opening is greater than the region in which the contact hole SC0 is to be formed. Next, the interlayer insulating film II3 is etched by the self-alignment processing by using the pattern of photoresist PHR and the contact hole SC0 is formed.

Here, there is considered a case where, for example, the region in which the contact hole SC0 is to be formed is a region sandwiched between a pair of bit lines BL and the photoresist PHR is formed so that the opening is greater than the region sandwiched between a pair of bit lines BL. At this time, the interlayer insulating film II3 and the interlayer insulating film II2 in the opening of the photoresist PHR is etched downward from above in FIG. 18 by an etchant of silicon oxide film, and for example, the coated insulating film CL of silicon nitride film immediately below the etched interlayer insulating film II3 functions as a stopper of the etching. However, in practice, the etching of the silicon nitride film is completed, after the coated insulating film CL is slightly etched, specifically, after the coated insulating film CL is etched downward from above in FIG. 18 by an amount corresponding to the etching selectivity of the etchant between the silicon nitride film and the silicon oxide film. The processing in which the etching has been performed as described above and the contact hole SC0 is formed is referred to as the self-alignment processing.

In FIG. 18, the contact hole SC0 is formed without deviation with respect to the opening of the photoresist PHR in the horizontal direction in FIG. 18, and the contact hole SC0 is formed so that the central axis of the contact hole SC0 is a substantially central position between the position of the left-hand side bit line BL and the position of the right-hand side bit line BL in FIG. 18. In contrast to this, as shown in FIG. 19, when the position of the opening of the photoresist PHR is shifted to the left in FIG. 19 from the desired position, the contact hole SC0 is formed by the self-alignment processing in the same manner as in FIG. 18, but the contact hole SC0 is formed so that the central axis of the contact hole SC0 is shifted to the left as compared with FIG. 18. Also in FIG. 19, in the same manner as in FIG. 18, the etching is completed after the silicon nitride film CL is etched downward from above in FIG. 19 by an amount corresponding to the etching selectivity with the interlayer insulating film II3.

After the processing of FIG. 18 or FIG. 19 is performed, for example, a conductive film of polycrystalline silicon to which conductive impurities are added is filled inside the contact hole SC0. This processing is performed by the CVD method, and when a thin film of polycrystalline silicon is also formed over the interlayer insulating film II3, the thin film of polycrystalline silicon over the interlayer insulating film II3 is removed by the CMP or the etchback. In this way, the second plug SC shown in FIG. 7 is formed.

The thin film of polycrystalline silicon over the interlayer insulating film II3 may be patterned without change and be used as the wiring 2G.

After that, the wiring 2G is formed by, for example, the CVD so as to be in contact with the upper surface of the second plug SC over the interlayer insulating film II3. It is preferable that the wiring 2G is formed by, for example, a conductive film of polycrystalline silicon to which conductive impurities are added.

Accordingly, the aspect shown in FIG. 7 or 10 is formed. Thereafter, each layer higher than the wiring 2G shown in FIG. 3 is formed by a publicly known method.

Next, functions and effects of the embodiment will be described with reference to a comparative example in FIGS. 20 to 25.

Figure 20:
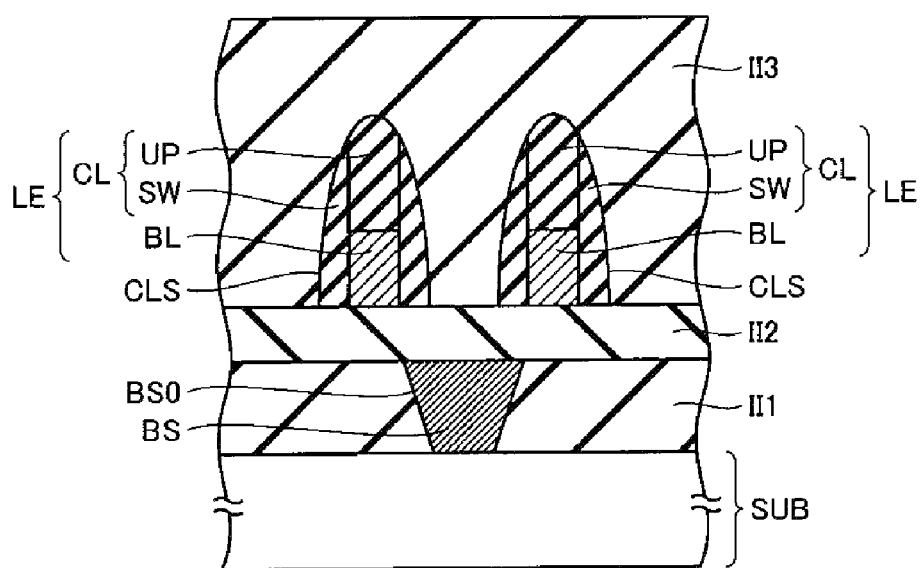
FIG. 20 is a schematic cross-sectional view showing a configuration of bit lines and a region near the bit lines of a comparative example.

Referring to FIG. 20, also in the comparative example, the wiring structure LE has the bit line BL and the coated insulating film CL, and the coated insulating film CL is constituted by the upper insulating film UP and the side wall-insulating film SW. However, in FIG. 20, the additional side wall-insulating film SOx is not formed and the coated film surface CLS is not perpendicular to the main surface of the semiconductor substrate SUB. In the cross-sectional view in FIG. 20, the coated film surface CLS has a shape like a parabola in which the width of the wiring structure LE gradually decreases upward from below.

Figure 21:
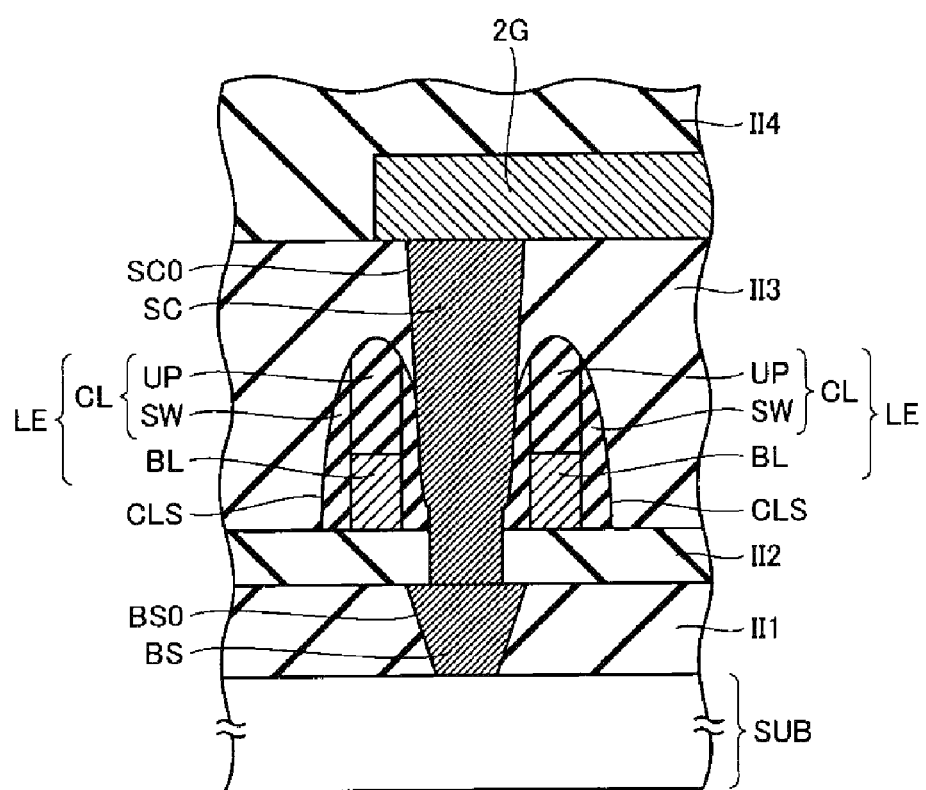
FIG. 21 is a schematic cross-sectional view showing a state in which the second plug is formed in the comparative example in FIG. 20 in the same manner as in FIG. 7.
Figure 22:
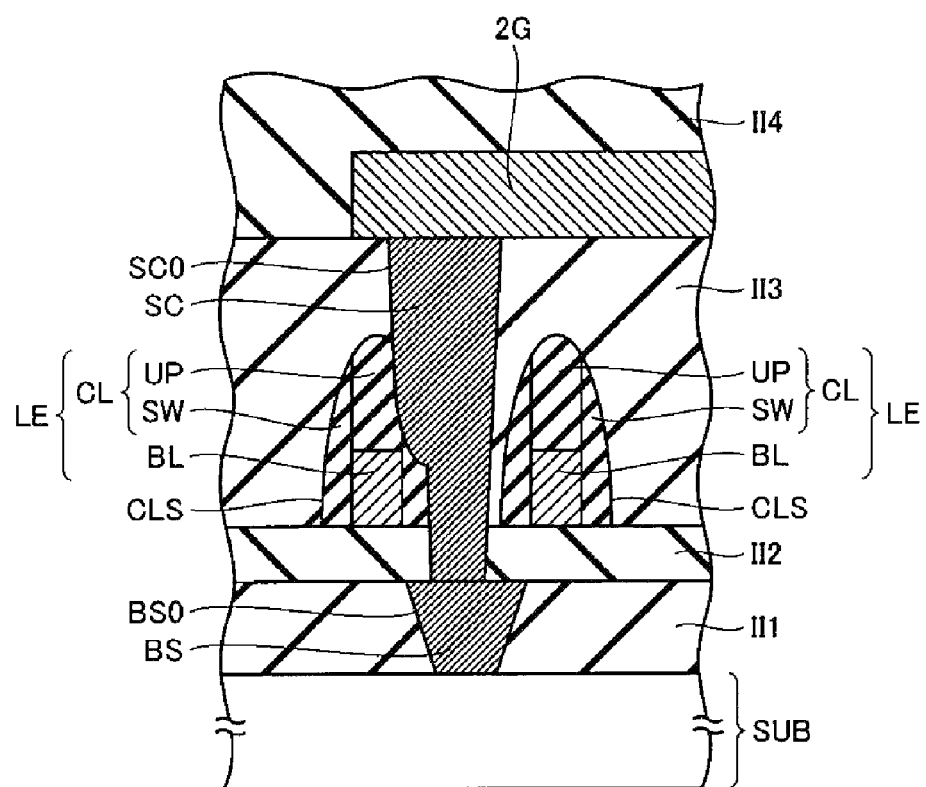
FIG. 22 is a schematic cross-sectional view showing a state in which the second plug is formed so that the position of the second plug is shifted with respect to the comparative example in FIG. 20 in the same manner as in FIG. 10.

Referring to FIGS. 21 and 7, when the second plug SC is formed in FIG. 20 without its position being shifted in the horizontal direction in the same manner as in FIG. 7, the distance between the second plug SC and the bit line BL is shorter than that in the case in which the second plug SC is formed in FIG. 6 without its position being shifted as shown in FIG. 7. Referring to FIGS. 22 and 10, when the position is shifted in FIG. 20 in the same manner as in FIG. 10, the distance between the second plug SC and the bit line BL is shorter than that in FIG. 10 in the same manner as described above. The other configurations of the comparative example in FIGS. 20 to 22 are the same as those in the embodiment.

In the manufacturing method of the comparative example described above, referring to FIG. 23, the coated insulating film CL is anisotropically etched (etched back) after the same processing as that in FIGS. 11 to 13 of the embodiment are performed. By the processing, the insulating film UP forms the upper insulating film UP whose upper portion is roundly pointed and the insulating film SW forms the side wall-insulating film SW of the bit line BL whose width increases downward from above (the surface CLS is not perpendicular to the interlayer insulating film II). The coated insulating film CL including the insulating films UP and SW forms the coated film surface CLS having a parabolic shape in which the surface of the upper insulating film UP and the surface of the side wall-insulating film SW continue smoothly. In this way, the wiring structure LE is formed.

Figure 23:
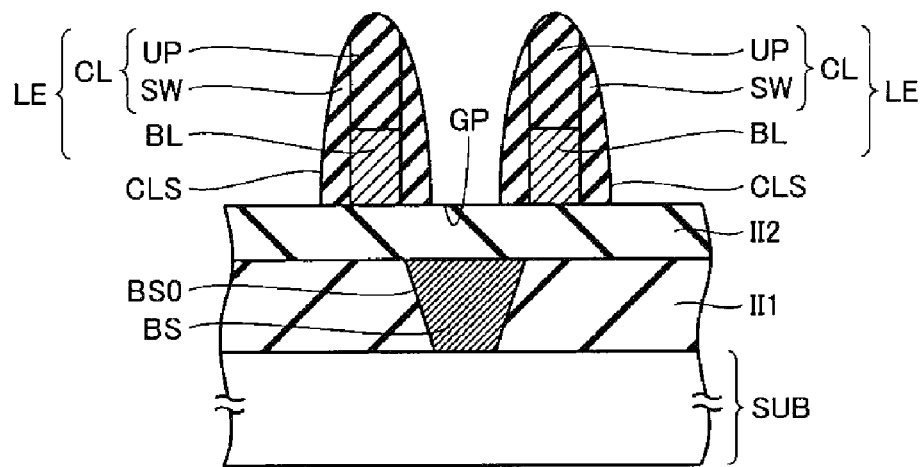
FIG. 23 is a schematic cross-sectional view showing a process following FIG. 13 of the embodiment in a method of manufacturing the semiconductor device according to the comparative example.

In the manufacturing method of the comparative example, the insulating film SOx for forming the additional side wall-insulating film SOx (see FIG. 14) as in the embodiment is not formed. Therefore, the insulating films UP and SW are anisotropically etched depending on the thickness thereof with respect to the vertical direction, and thus the cross-sectional shape shown in FIG. 23 is exhibited.

Figure 24:
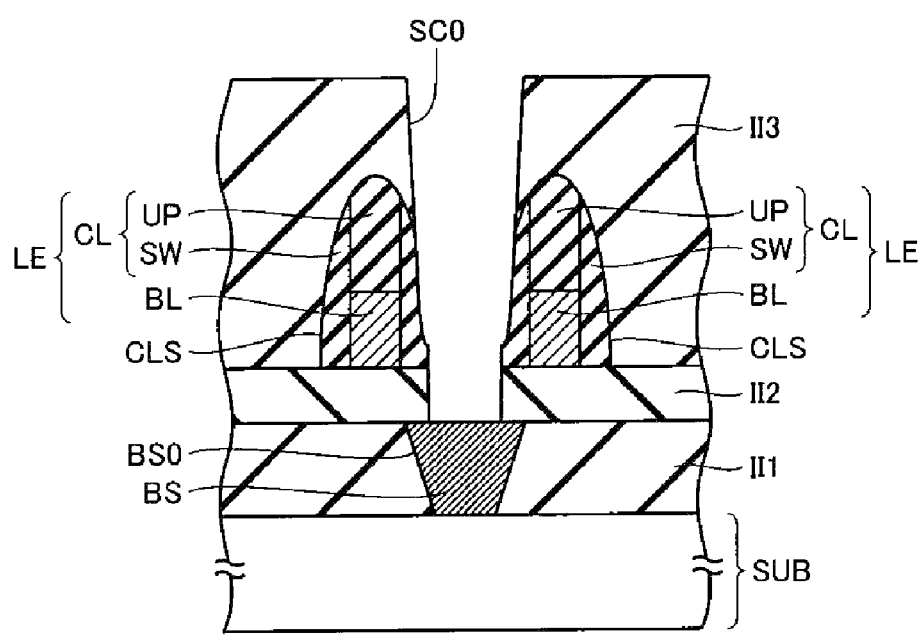
FIG. 24 is a schematic cross-sectional view showing a state in which the same process as that in FIG. 18 of the embodiment is performed in the method of manufacturing the semiconductor device according to the comparative example.
Figure 25:
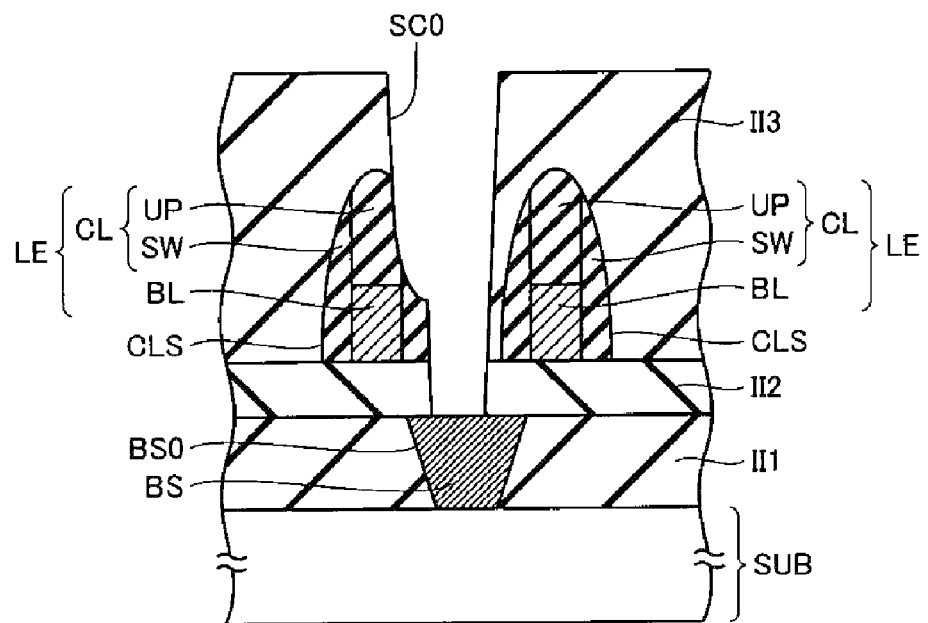
FIG. 25 is a schematic cross-sectional view showing a state in which the same process as that in FIG. 19 of the embodiment is performed in the method of manufacturing the semiconductor device according to the comparative example.

FIG. 24 shows an aspect in which the contact hole SC0 is formed without a positional shift with respect to the wiring structure LE described above in the same manner as in FIG. 18, and FIG. 25 shows an aspect in which the contact hole SC0 is formed with a positional shift with respect to the wiring structure LE described above in the same manner as in FIG. 19.

Figure 26:
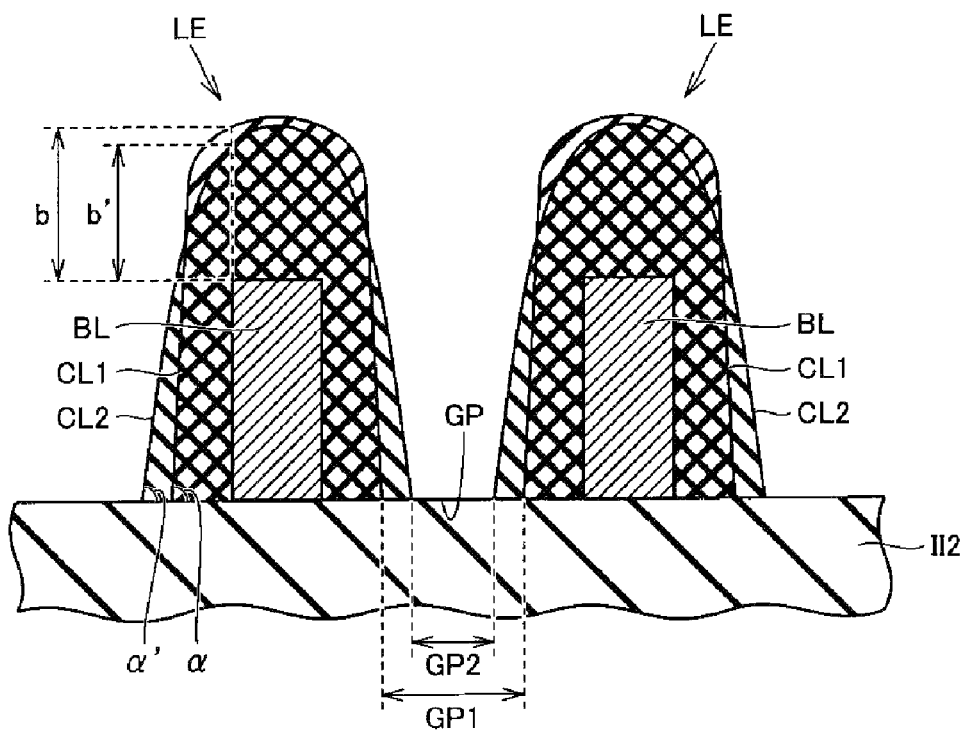
FIG. 26 is a schematic cross-sectional view in which the embodiment and the comparative example are drawn so that they are overlapped each other in order to compare the shapes and dimensions of the bit lines and the wiring structure between the embodiment and the comparative example.

Referring to FIG. 26, in the embodiment and the comparative example, it is assumed that the shape and the dimensions of the formed bit line BL, the thickness and the shape of the insulating films UP and SW (before being etched), and the gap between the bit lines BL adjacent to each other are the same. When an angle of the surface of the coated insulating film CL1 formed in the embodiment with respect to the main surface of the semiconductor substrate SUB (the upper surface of the interlayer insulating film II2) is assumed to be $\alpha$ and the above-mentioned angle of the surface of the coated insulating film CL2 formed in the comparative example is assumed to be $\alpha'$, $\alpha' < \alpha$ holds. Although it is preferable that $\alpha$ is 90°, if $85° \leq \alpha$ holds, $\alpha$ is assumed to be perpendicular as described above because the cross-sectional shape of the side wall of the bit line BL is not completely perpendicular to the main surface of the semiconductor substrate SUB and there is a variation of the processes.

Therefore, when the gap between the coated insulating films CL1 adjacent to each other on the surface of the interlayer insulating film II2 in the wiring structure of the embodiment is assumed to be GP1 and the same gap in the wiring structure of the comparative example is assumed to be GP2, if the film thickness over the bit line BL is the same between the embodiment and the comparative example, that is, in the case of b=b', GP1>GP2 holds. That is, when the surface CLS of the coated insulating film CL1 is formed to be perpendicular to the surface of the interlayer insulating film II2 as in the embodiment, it is possible to widen the gap GP1.

Therefore, for example, when forming a deep contact hole SC0 that is required to penetrate the interlayer insulating film II3, which is the same layer as that in which the bit line BL is formed, and the interlayer insulating film II2 immediately below the interlayer insulating film II3 and further reach the first plug BS below the interlayer insulating film II2, it is possible to prevent a problem such as a case in which the etching does not reach a desired depth, a desired opening cannot be obtained in a lower portion, and a trouble such as conduction failure of the second plug SC is suppressed.

However, for example, even when the perpendicular surface CLS is realized only in a very low region near the surface of the interlayer insulating film II2, if the perpendicular surface CLS is not realized in a region higher than the very low region, it is not possible to achieve a sufficient effect of obtaining an opening broad enough as the perpendicular surface CLS because a region including the perpendicular surface CLS is small. Therefore, there is a probability of causing an opening failure of the contact hole SC0 accordingly. Thus, it is preferable that the perpendicular surface CLS is realized in the entire region lower than a position lower than the coated film uppermost portion CLT by, at least, a length x in FIG. 9. By this way, there exists a sufficient region having the perpendicular surface CLS, and thus an effect of being able to reliably form the opening of the contact hole SC0, which reaches a desired depth and has a sufficient plane area, becomes great.

In addition, when the coated insulating film CL having the perpendicular surface CLS is formed as in the embodiment, in the case of GP1=GP2, the thickness in the horizontal direction in FIG. 26 of a portion of the coated insulating film CL located outside the bit line BL is larger than that of the coated insulating film CL of the comparative example in both FIGS. 16 and 17 (larger, in particular, above the bit line BL). The thickness of the coated insulating film CL tends to be larger, in particular, in the horizontal direction in a region higher than the bit line BL, that is, in a region in which the coated insulating film CL is easily etched depending on the etching selectivity with the interlayer insulating film II3 at the time of the formation of the contact hole SC0.

Therefore, even when the coated insulating film CL is etched downward from above depending on the etching selectivity with the interlayer insulating film II3 by the self-alignment processing in order to form the contact hole SC0 shown in FIG. 18 and the like, it is possible to reduce the probability that a part of the side surface of the bit line BL is exposed by the etching. Accordingly, when a conductive film is filled inside the contact hole SC0 and the second plug SC is formed, it is possible to reduce the probability that the second plug SC and the bit line BL short-circuit each other and improve reliability of the corresponding portion.

In the embodiment, the thickness in the vertical direction in FIG. 26 of a portion of the coated insulating film CL located above the bit line BL becomes larger than that in the comparative example (larger, in particular, in a portion outside the bit line BL). The thickness in the vertical direction in FIG. 26 of a portion of the coated insulating film CL becomes larger in particular in an outer region of the coated insulating film CL, that is, a region close to the coated film surface CLS.

Therefore, even when the coated insulating film CL is etched downward from above depending on the etching selectivity with the interlayer insulating film II3 by the self-alignment processing in order to form the contact hole SC0 shown in FIG. 18 and the like, it is possible to reduce the probability that a part of the upper surface of the bit line BL is exposed by the etching. Accordingly, when a conductive film is filled inside the contact hole SC0 and the second plug SC is formed, it is possible to reduce the probability that the second plug SC and the bit line BL short-circuit each other and improve reliability of the corresponding portion.

Referring to FIG. 9 again, it is preferable that $b \geq 0.95a$ holds in the embodiment. However, when the length corresponding to the length b in FIG. 9 in the embodiment is assumed to be b' in the comparative example, $b > b'$ holds, and thus $b' < 0.95a$ may hold. Furthermore, it is preferable that $d \geq 0.86c$ holds in the embodiment, but in the comparative example, d cannot be defined because the coated film surface CLS is not perpendicular to the main surface of the semiconductor substrate SUB.

In the embodiment in which the condition of $b \geq 0.95a$ and $d \geq 0.86c$ is satisfied, the upper surface TU (which is a part of the coated film surface CLS) of the coated insulating film CL that covers the upper surface of the bit line BL has an aspect nearly equal to a flat surface in parallel with the main surface of the semiconductor substrate SUB. Therefore, the thickness in the vertical direction in FIG. 26 of a portion of the coated insulating film CL that covers the upper surface of the bit line BL is larger than that in the comparative example. Accordingly, it is possible to suppress short-circuit between the second plug SC and the bit line BL by the same theory as described above.

The coated film surface CLS having a perpendicular portion described above and the coated film surface CLS nearly equal to a flat surface in parallel with the main surface of the semiconductor substrate SUB can be realized by the respective processes in FIGS. 14 to 16. That is, in the manufacturing method of the embodiment, the insulating film SOx which covers the side walls of the bit line BL and the coated insulating film CL and whose material is different from that of the coated insulating film CL is formed so as to cover the side wall of the bit line BL, and in a state in which the insulating film SOx remains, the insulating film SOx and the insulating film SW in the other region are removed. That is, the insulating film SOx remains, and thus the side walls of the bit line BL and the coated insulating film CL, which are covered by the insulating film SOx, are protected. Therefore, the side walls of the bit line BL and the coated insulating film CL are hardly etched.

The side surface of the bit line BL formed by a publicly known method is substantially orthogonal to the surface of the interlayer insulating film II2. Therefore, the surface CLS of the side wall-insulating film SW finally remaining on the side surface of the bit line BL is substantially orthogonal to the surface of the interlayer insulating film II2 because the surface CLS of the side wall-insulating film SW is protected by the additional side wall-insulating film SOx and is not etched. That is, the surface CLS becomes perpendicular to the main surface of the semiconductor substrate SUB.

Furthermore, for example, in the process of FIG. 16, when the insulating films SW and UP located immediately above the bit line BL are removed at the same time when the insulating film SW and the like located immediately above the first plug BS are removed, the insulating film SW located immediately above the first plug BS is etched downward from above in FIG. 16, and thus the insulating films SW and UP immediately above the bit line BL are also etched downward from above in FIG. 16. The upper surface of the bit line BL formed by a publicly known method is substantially parallel to the surface of the interlayer insulating film II2. Therefore, the surface CLS of the coated insulating film CL located so as to cover the upper surface of the bit line BL after the process of FIG. 16 has an aspect which is nearly in parallel to the surface of the interlayer insulating film II2. The surface CLS of the coated insulating film CL located so as to cover the upper surface of the bit line BL after the process of FIG. 16 has an aspect which is nearly in parallel to the surface of the interlayer insulating film II2 and can satisfy the condition of b≥0.95a and d≥0.86c.

Meanwhile, when the surface CLS and the interlayer insulating film II2 are completely in parallel to each other, the relation of b=a and d=c holds. However, actually, the length varies within a range of 5% of the value also by the etching of the coated insulating film CL above the bit line BL, b≥0.95a holds. In addition, regarding c and d which represent the heights from the surface of the interlayer insulating film II2 to the coated film surface CLS, a thickness variation error is generated within a range of 10% of the value of c and the thickness variation is generated within a range of 10% of the value of c when the etching of the process in FIG. 16 is performed. An error of the value of c is generated within a range of 14%, which is the sum of squares of the above, and thus d≥0.86c holds.

In addition, in the embodiment, across the entire portion in a direction in which the wiring structure LE extends in a plan view, the first insulating film is not formed in a gap between a pair of wiring structures LE adjacent to each other. That is, in the process of FIG. 16, all the insulating films SW in the region GP are removed. By this way, as shown in FIG. 4A, the contacts BS and CG can be extracted as a conductive layer from anywhere in a region in which the wiring structure LE is not disposed. Furthermore, the first insulating film is not formed in a region sandwiched between a pair of wiring structures LE adjacent to each other. Therefore, it is not necessary to etch the first insulating film (the insulating film SW and the like) in a region sandwiched between a pair of wiring structures LE when the contact hole SC0 is opened. Accordingly, it is possible to reduce the etching amount of the first insulating film when the contact hole SC0 is opened.

Furthermore, when the material of the additional side wall-insulating film SOx is different from that of the coated insulating film CL, it is possible to secure the etching selectivity between the coated insulating film CL and the additional side wall-insulating film SOx and to make the coated insulating film CL to be an etching stopper for the additional side wall-insulating film SOx.

Moreover, when the material of the additional side wall-insulating film SOx is different from that of the interlayer insulating film II3 (the interlayer insulating film II3a), it is possible to secure the etching selectivity between the additional side wall-insulating film SOx and the interlayer insulating film II3a and to make the additional side wall-insulating film SOx to be an etching stopper for the interlayer insulating film II3a. Therefore, the additional side wall-insulating film SOx has a function to protect the coated insulating film CL and the bit line BL from etching.

While the invention made by the present inventor has been specifically described based on the embodiment, the present invention is not limited to the embodiment described above, and it is needless to say that the invention can be variously modified without departing from the gist of the present invention.

What is claimed is:

1. A semiconductor device comprising:
   a semiconductor substrate including a main surface;
   a first conductive layer formed over the main surface;
   a first interlayer insulating film formed over the first conductive layer;
   a bit line located over the first interlayer insulating film;
   a first insulating film formed so as to cover an upper surface and a side surface of the bit line;
   a second interlayer insulating film formed so as to cover the first interlayer insulating film and the first insulating film; and
   a second conductive layer that penetrates the first and the second interlayer insulating films and reaches the first conductive layer,
   wherein the first insulating film has an upper portion and a lower portion,
   wherein the upper portion extends in a vertical direction from an uppermost point on the first insulating film to a first location located between the uppermost point on the first insulating film and the upper surface of the bit line, and the upper portion has a first thickness, measured from the uppermost point to the first location, equaling to a second thickness of a portion of the first insulating film extending in a horizontal direction from the sidewall surface of the bit line to a second location that, is an end portion of the first insulating film, wherein the lower portion extends from the first location to the main surface of the semiconductor substrate, and
   wherein an entire side surface of the lower portion of the insulating film has an angle greater than or equal to 85 degrees and equal to or less than 90 degree with respect to the main surface of semiconductor substrate.

2. The semiconductor device according to claim 1, wherein a third thickness extends from the upper surface of the bit line, at an end portion of the bit line in a width direction of the bit line, towards the uppermost portion of the first insulating film, and wherein the third thickness is equal to 0.95 times a fourth thickness, which is the maximum thickness of the first insulating film that covers the upper surface of the bit line from the uppermost portion of the first insulating film to the upper surface of the bit line.

3. The semiconductor device according to claim 1, wherein a height of the lower portion of the first insulating film, measured from a top surface of the first interlayer insulating film to the first location, is equal to 0.86 times an entire height of of the first insulating film measured from the uppermost point to the first insulting film to the top surface of the first interlayer insulating film.

4. The semiconductor device according to claim 1, further comprising:
   a plurality of wiring structures, each of which includes the bit line and the first insulating film, runs side by side with a gap therebetween in a plan view,
   wherein the first insulating film is not formed across the gap in an entire portion in a direction in which the wiring structure extends in a plan view.

5. The semiconductor device according to claim 1 further comprising:
   a second insulating film that covers a side surface of the first insulating film,
   wherein a material of the first insulating film is different from that of the second insulating film.

6. The semiconductor device according to claim 5, wherein the material of the second insulating film is different from that of the second interlayer insulating film.

7. The semiconductor device according to claim 5, wherein the second insulating film projects higher than the uppermost portion of the first insulating film that covers the upper surface of the bit line.

8. The semiconductor device according to claim 7, wherein a portion of the first insulating film located immediately above a region outside the side surface of the bit line projects higher than a portion of the first insulating film located immediately above the upper surface of the bit line.

\* \* \* \* \*